(12) United States Patent
Kaneko et al.

(10) Patent No.: US 12,744,187 B2
(45) Date of Patent: Sep. 22, 2026

(54) PLASMA PROCESSING APPARATUS

(71) Applicant: TOKYO ELECTRON LIMITED, Tokyo (JP)

(72) Inventors: Kazushi Kaneko, Yamanashi (JP); Hiroshi Kondo, Tokyo (JP); Eiki Kamata, Yamanashi (JP); Satoru Kawakami, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 479 days.

(21) Appl. No.: 18/515,099

(22) Filed: Nov. 20, 2023

(65) Prior Publication Data

US 2024/0186113 A1 Jun. 6, 2024

(30) Foreign Application Priority Data

Dec. 1, 2022 (JP) ................................ 2022-192560

(51) Int. Cl.
*H01J 37/32* (2006.01)

(52) U.S. Cl.
CPC .. *H01J 37/32247* (2013.01); *H01J 37/32238* (2013.01)

(58) Field of Classification Search
CPC ........... H01J 37/32247; H01J 37/32238; H01J 37/32266; H01J 37/32211; H01J 37/32219
See application file for complete search history.

(56) References Cited

U.S. PATENT DOCUMENTS

2011/0088848 A1 4/2011 Kim et al.
2024/0203692 A1* 6/2024 Oowada ............ H01J 37/32284

FOREIGN PATENT DOCUMENTS

JP 2009-245593 A 10/2009
JP 2016225047 A * 12/2016 ............ H01J 37/321

* cited by examiner

*Primary Examiner* — John J Brayton
(74) *Attorney, Agent, or Firm* — Fenwick & West LLP

(57) ABSTRACT

There is a plasma processing apparatus comprising: a processing chamber configured to provide a processing space; an electromagnetic wave generator configured to generate electromagnetic waves for plasma excitation supplied to the processing space; a dielectric provided with a first surface facing the processing space; and an electromagnetic wave supply portion configured to supply the electromagnetic waves to the processing space through the dielectric, wherein the dielectric includes: a cell serving as a plasma generation space on the first surface side, a plurality of grooves formed on a second surface opposite to the first surface, the grooves surrounding the cell without communicating with the cell; and resonators including C-shaped ring members made of conductors inserted into the plurality of grooves, wherein the resonators are capable of resonating with magnetic field components of the electromagnetic waves and have a size smaller than a wavelength of the electromagnetic wave.

19 Claims, 15 Drawing Sheets

PLASMA PROCESSING APPARATUS

CROSS-REFERENCE TO RELATED APPLICATIONS

This application claims priority to Japanese Patent Application No. 2022-192560, filed on Dec. 1, 2022, the entire contents of which are incorporated herein by reference.

TECHNICAL FIELD

The present disclosure relates to a plasma processing apparatus.

BACKGROUND

Japanese Laid-open Patent Publication No. 2009-245593 discloses a plasma processing apparatus that supplies microwaves for plasma excitation to a processing chamber to generate plasma.

SUMMARY

The present disclosure provides a plasma processing apparatus that can realize high density of plasma over a wide range.

In accordance with an exemplary embodiment of the present disclosure, there is a plasma processing apparatus comprising: a processing chamber configured to provide a processing space; an electromagnetic wave generator configured to generate electromagnetic waves for plasma excitation supplied to the processing space; a dielectric provided with a first surface facing the processing space; and an electromagnetic wave supply portion configured to supply the electromagnetic waves to the processing space through the dielectric, wherein the dielectric includes: a cell serving as a plasma generation space on the first surface side of the dielectric, a plurality of grooves formed on a second surface opposite to the first surface, the grooves surrounding the cell without communicating with the cell; and a plurality of resonators including C-shaped ring members made of conductors inserted into the plurality of grooves, wherein the resonators are formed as a part of the dielectric, and the resonators are capable of resonating with magnetic field components of the electromagnetic waves and have a size smaller than a wavelength of the electromagnetic wave.

BRIEF DESCRIPTION OF THE DRAWINGS

FIG. 3 is a cross-sectional view illustrating an example of an A-A cross-section of FIG. 2.

FIG. 12 is a cross-sectional view illustrating an example of an I-I cross section of FIG. 11.

DETAILED DESCRIPTION

Hereinafter, embodiments of the disclosed plasma processing apparatus will be described in detail on the basis of the drawings. Further, the disclosed technology is not limited to the following embodiments.

However, in a plasma processing apparatus using microwaves for plasma excitation, power of microwaves supplied into a processing chamber may be increased in order to increase an electron density of plasma. As the power of the microwaves supplied into the processing chamber is increased, the electron density of the plasma can be increased.

Here, it is known that, when the electron density of plasma reaches an upper limit due to an increase in the power of the microwaves supplied into the processing chamber, a permittivity of a space within the processing chamber becomes negative. This upper limit of the electron density is called as "cutoff density." Further, a refractive index is known as an index indicating whether microwaves propagate through a space. The refractive index N is expressed by Equation (1) below.

$$N = \sqrt{\varepsilon}\sqrt{\mu} \tag{1}$$

Here, ε: permittivity, and μ: permeability

The permeability is generally positive, and thus, when the permittivity of the space within the processing chamber becomes negative, the refractive index of the space within the processing chamber becomes a pure imaginary number according to Equation (1) above. Accordingly, the microwaves are attenuated and cannot propagate through the space within the processing chamber. Thus, when the electron density of the plasma reaches the cutoff density, the microwaves cannot propagate in the space within the processing chamber, and thus, the power of the microwaves is not sufficiently absorbed by plasma. As a result, there is a problem that high density of the plasma generated in the processing chamber over a wide range is hindered.

Therefore, a technology capable of realizing high density in a wide range of plasma is expected.

First Embodiment

[Configuration of Plasma Processing Apparatus]

Figure 1:
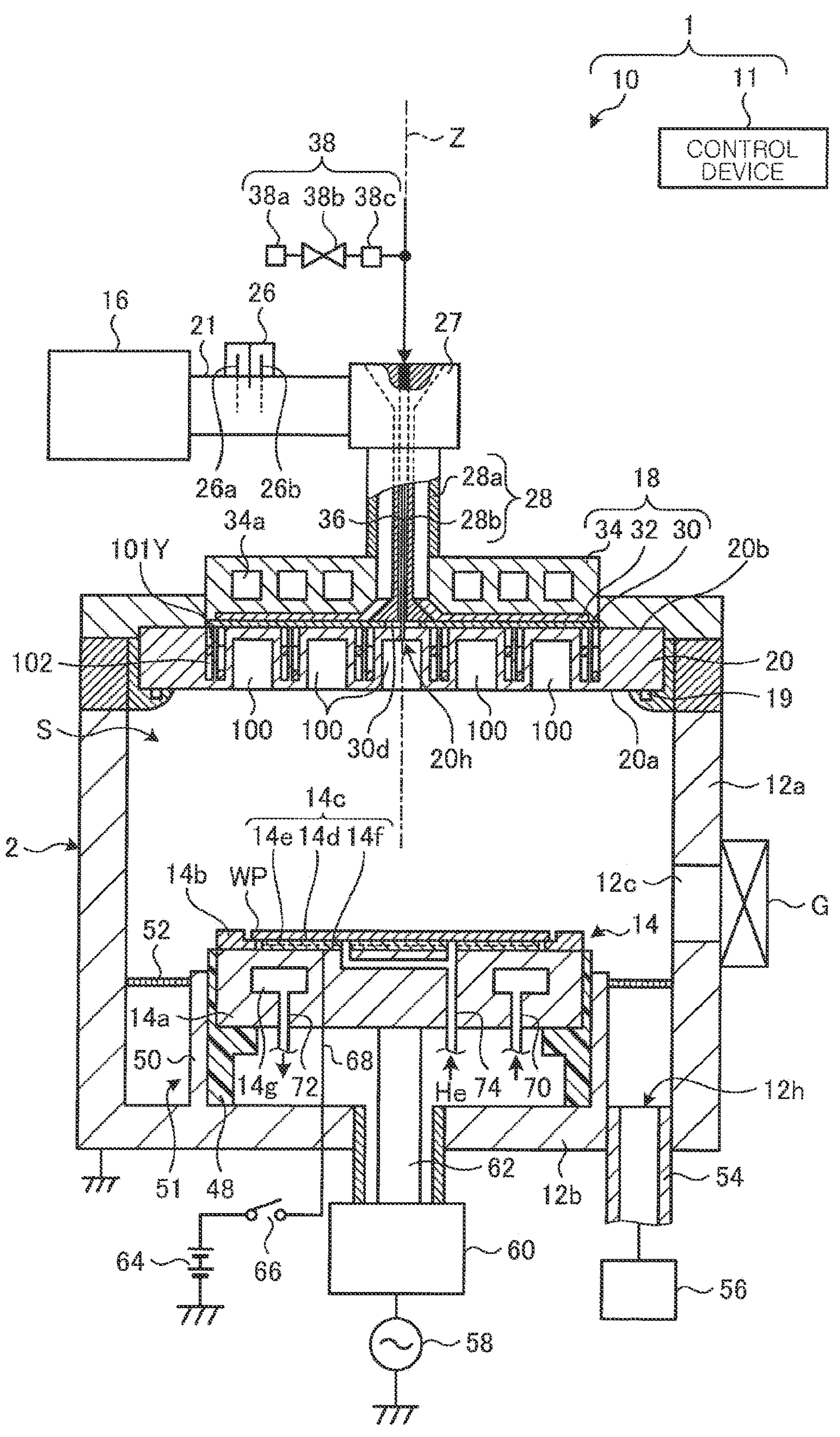
FIG. 1 is a schematic cross-sectional view illustrating an example of a configuration of a plasma processing apparatus according to a first embodiment.

FIG. 1 is a schematic cross-sectional view illustrating an example of a configuration of a plasma processing apparatus 1 according to a first embodiment. The plasma processing apparatus 1 includes an apparatus body 10 and a control device 11. The apparatus body 10 includes a processing chamber 12, a stage 14, a microwave output apparatus (an example of an electromagnetic wave generator) 16, an antenna 18, and a dielectric window 20.

The processing chamber 12 is formed in a substantially cylindrical shape, for example, by using aluminum of which a surface has been anodized, and provides a substantially cylindrical processing space S therein. The processing chamber 12 is securely grounded. Further, the processing chamber 12 includes a side wall 12*a* and a bottom 12*b*. Ae central axis of the side wall 12*a* is defined as an axis Z. The bottom 12*b* is provided on the lower end side of the side wall 12*a*. An exhaust port 12*h* for exhaust is provided at the bottom 12*b*. Further, an upper end portion of the side wall 12*a* is open. Further, an inner wall surface of the side wall 12*a* faces the processing space S. That is, the side wall 12*a* is provided with an inner wall surface thereof facing the processing space S.

An opening 12*c* for loading/unloading an object WP to be processed in the side wall 12*a*. The opening 12*c* is opened and closed by a gate valve G.

The dielectric window 20 is provided at the upper end portion of the side wall 12*a*, and blocks an opening of the upper end portion of the side wall 12*a* from above. A lower surface (an example of a first surface) 20*a* of the dielectric window (an example of a dielectric) 20 faces the processing space S. That is, the dielectric window 20 is provided with the lower surface 20*a* thereof facing the processing space S. An O-ring 19 is disposed between the dielectric window 20 and an upper end portion of the side wall 12*a*. As will be described below, the dielectric window 20 includes a resonator array structure formed by arranging a plurality of resonators that are capable of resonating with magnetic field components of microwaves and have a size smaller than a wavelength of the microwaves.

The stage 14 is accommodated within the processing chamber 12. The stage 14 is provided to face the dielectric window 20 in a direction of the axis Z. A space between the stage 14 and the dielectric window 20 is the processing space S. The object to be processed WP is mounted on the stage 14.

The stage 14 includes a base 14*a* and an electrostatic chuck 14*c*. The base 14*a* is formed of a conductive material such as aluminum in a substantially disk shape. The base 14*a* is disposed within the processing chamber 12 so that a central axis of the base 14*a* approximately matches the axis Z.

The base 14*a* is supported by a cylindrical support portion 48 formed of an insulating material and extending in the axis Z direction. A conductive cylindrical support portion 50 is provided on an outer circumference of the cylindrical support portion 48. The cylindrical support portion 50 extends from the bottom 12*b* of the processing chamber 12 toward the dielectric window 20 along the outer circumference of the cylindrical support portion 48. A ring-shaped exhaust passage 51 is formed between the cylindrical support portion 50 and the side wall 12*a*.

A ring-shaped baffle plate 52 with a plurality of through holes formed in a thickness direction is provided in an upper portion of the exhaust passage 51. The above-described exhaust port 12*h* is provided below the baffle plate 52. An exhaust apparatus 56 including a vacuum pump such as a turbomolecular pump, an automatic pressure control valve, or the like is connected to the exhaust port 12*h* through an exhaust pipe 54. Using the exhaust apparatus 56, the processing space S can be depressurized to a desired vacuum level.

The base 14*a* functions as a high frequency electrode. A high frequency power supply 58 for RF bias is electrically connected to the base 14*a* via a power supply rod 62 and a matching unit 60. The high frequency power supply 58 supplies a bias power at a predetermined frequency (for example, 13.56 MHz) suitable for control of energy of ions attracted to the object to be processed WP through the matching unit 60 and the power supply rod 62 to the base 14*a*.

The matching unit 60 accommodates a matcher for matching between an impedance on the high frequency power supply 58 side and an impedance on the load side, mainly the electrodes, plasma, and the processing chamber 12. The matcher includes a blocking capacitor for generating a self-bias.

The electrostatic chuck 14*c* is provided on an upper surface of the base 14*a*. The electrostatic chuck 14*c* attracts and holds the object to be processed WP by using an electrostatic force. The electrostatic chuck 14*c* has a substantially disk-shaped outer shape and includes an electrode 14*d*, an insulating film (dielectric film) 14*e*, and an insulating film (dielectric film) 14*f*. The electrostatic chuck 14*c* is disposed on the upper surface of the base 14*a* so that a central axis of the electrostatic chuck 14*c* approximately coincides with the axis Z. The electrode 14*d* of the electrostatic chuck 14*c* is formed of a conductive film and is provided between the insulating film 14*e* and the insulating film 14*f*. A direct current power supply 64 is electrically connected to the electrode 14*d* via a coated wire 68 and a switch 66. The electrostatic chuck 14*c* can attract and hold the object to be processed WP on an upper surface thereof using an electrostatic force generated by a direct current voltage applied from the direct current power supply 64. The upper surface of the electrostatic chuck 14*c* is a mounting surface on which the object to be processed WP is mounted, and faces the processing space S. That is, the electrostatic chuck 14*c* is provided so that the upper surface which is the mounting surface faces the processing space S. Further, an edge ring 14*b* is provided on the base 14*a*. The edge ring 14*b* is disposed to surround the object to be processed WP and the electrostatic chuck 14*c*. The edge ring 14*b* is sometimes called as a focus ring.

A flow path 14*g* is provided inside the base 14*a*. A refrigerant is supplied to the flow path 14*g* through a pipe 70 from a chiller unit (not illustrated). The refrigerant supplied to the flow path 14*g* returns to the chiller unit through the pipe 72. The refrigerant of which a temperature is controlled by the chiller unit circulates the inside of the flow path 14*g* of the base 14*a*, so that a temperature of the base 14*a* is controlled. When the temperature of the base 14*a* is controlled, a temperature of the object to be processed WP on the electrostatic chuck 14*c* is controlled via the electrostatic chuck 14*c* on the base 14*a*.

Further, a pipe 74 for supplying a heat transfer gas such as an He gas to an interface between the upper surface of the electrostatic chuck 14*c* and a back surface of the object to be processed WP is formed on the stage 14.

A microwave output apparatus 16 outputs microwaves (an example of electromagnetic waves) for exciting a processing gas supplied into the processing chamber 12. In the microwave output apparatus 16, adjustment of a frequency, power, and bandwidth of the microwaves is possible. The microwave output apparatus 16 can generate microwaves at a single frequency, for example, by setting the bandwidth of the microwaves to approximately 0. Further, the microwave output apparatus 16 can generate microwaves containing a plurality of frequency components belonging to a predetermined frequency bandwidth (hereinafter appropriately referred to as "broadband microwave"). Powers of the plurality of frequency components may be the same, or a power of only a center frequency component within the band may be higher than those of the other frequency components. The microwave output apparatus 16 may adjust the power of the microwave, for example, within a range of 0 W to 5000 W. The microwave output apparatus 16 may adjust frequencies of the microwaves or a central frequency of the broadband microwave within a range of, for example, 2.3 GHz to 2.5 GHz, and may adjust the bandwidth of the broadband microwaves within the range of, for example, 0 MHz to 100 MHz. Further, the microwave output apparatus 16 may adjust a frequency pitch (carrier pitch) of the plurality of frequency components of the broadband microwave within a range of, for example, 0 to 25 kHz.

Further, the apparatus body 10 includes a waveguide 21, a tuner 26, a mode converter 27, and a coaxial waveguide 28. An output portion of the microwave output apparatus 16 is connected to one end of the waveguide 21. The other end of the waveguide 21 is connected to the mode converter 27. The waveguide 21 is, for example, a rectangular waveguide. The tuner 26 is provided for the waveguide 21. The tuner 26 includes a movable plate 26*a* and a movable plate 26*b*. An amount of protrusion of each of the movable plates 26*a* and 26*b* with respect to an internal space of the waveguide 21 is adjusted so that impedance of the microwave output apparatus 16 can be matched with impedance of a load.

The mode converter 27 converts a mode of the microwaves output from the waveguide 21 and supplies the microwaves of which the mode has been converted, to the coaxial waveguide 28. The coaxial waveguide 28 includes an outer conductor 28*a* and an inner conductor 28*b*. The outer conductor 28*a* and the inner conductor 28*b* have a substantially cylindrical shape. The outer conductor 28*a* and the inner conductor 28*b* are disposed on an upper portion of the antenna 18 so that central axes of the outer conductor 28*a* and the inner conductor 28*b* approximately match the axis Z. The coaxial waveguide 28 transmits the microwaves of which the mode has been converted by the mode converter 27 to the antenna 18.

The antenna 18 supplies microwaves to the processing space S. The antenna 18 is an example of an electromagnetic wave supply portion. The antenna 18 is provided on a upper surface 20*b* of the dielectric window 20 and supplies the microwaves to the processing space S through the dielectric window 20. The antenna 18 includes a slot plate 30, a dielectric plate 32, and a cooling jacket 34. The slot plate 30 is made of conductive metal in a substantially disk shape. The slot plate 30 is provided on the upper surface 20*b* of the dielectric window 20 so that a central axis of the slot plate 30 matches the axis Z. A plurality of slot holes are formed in the slot plate 30. The plurality of slot holes constitute, for example, a plurality of slot pairs. Each of the plurality of slot pairs includes two slot holes having a shape of a long hole, which extend in directions intersecting each other. The plurality of slot pairs are arranged along one or more concentric circles around the central axis of the slot plate 30. Further, a through hole 30*d* through which a conduit 36 to be described below can pass is formed in a central portion of the slot plate 30.

The dielectric plate 32 is formed of a dielectric material such as quartz in a substantially disk shape. The dielectric plate 32 is provided on the slot plate 30 so that a central axis of the dielectric plate 32 approximately matches the axis Z. The cooling jacket 34 is provided on the dielectric plate 32. The dielectric plate 32 is provided between the cooling jacket 34 and the slot plate 30.

A surface of the cooling jacket 34 is conductive. A flow path 34*a* is formed inside the cooling jacket 34. A refrigerant is supplied to the flow path 34*a* from the chiller unit (not illustrated). A lower end of the outer conductor 28*a* is electrically connected to an upper surface of the cooling jacket 34. Further, a lower end of the inner conductor 28*b* passes through openings formed in central portions of the cooling jacket 34 and the dielectric plate 32 and is electrically connected to the slot plate 30.

The microwaves propagating within the coaxial waveguide 28 propagate within the dielectric plate 32 and are radiated into the processing space S from the plurality of slot holes of the slot plate 30 through the dielectric window 20.

The dielectric window 20 includes a resonator array structure formed by arranging a plurality of resonators that are capable of resonating with the magnetic field component of the microwaves and have a size smaller than the wavelength of the microwave.

The resonator array structure of the dielectric window 20 faces the processing space S, so that the microwaves supplied to the processing space S by the antenna 18 can resonate with the plurality of resonators of the resonator array structure of the dielectric window 20. The resonance between the microwaves and the plurality of resonators allows the microwave to be efficiently supplied to the processing space S of the processing chamber 12, and allows the permeability of the processing space S to be made negative. When the permeability of the processing space S is negative, the electron density of the plasma generated within the processing space S reaches the cutoff density, and even when the permittivity of the processing space S is negative, the refractive index becomes a real number according to Equation (1) above, and thus, the microwaves can propagate in the processing space S. Accordingly, even when the electron density of the plasma generated within the processing space S reaches the cutoff density, microwaves can propagate beyond a skin depth of the plasma, and the power of the microwaves is efficiently absorbed by the plasma. As a result, it is possible to generate high density plasma in a wide range beyond the skin depth of the plasma. That is, with the plasma processing apparatus 1 according to the present embodiment, it is possible to realize high density in a wide range of plasma by the resonator array structure of the dielectric window 20 facing the processing space S. A detailed configuration of the dielectric window 20 will be described below.

The conduit 36 is provided on the inner side of the inner conductor 28*b* of the coaxial waveguide 28. The through hole 30*d* through which the conduit 36 can pass is formed in the central portion of the slot plate 30. The conduit 36 extends through the inside of the inner conductor 28*b* and is connected to the gas supply portion 38.

The gas supply portion 38 supplies a processing gas for processing the object to be processed WP to the conduit 36. The gas supply portion 38 includes a gas supply source 38*a*, a valve 38*b*, and a flow rate controller 38*c*. The gas supply source 38*a* is a supply source for the processing gas. The valve 38*b* controls supplying and supply stopping of the processing gas from the gas supply source 38*a*. The flow rate controller 38*c* is, for example, a mass flow controller, and controls a flow rate of the process gas from the gas supply source 38*a*.

The processing gas supplied to the conduit 36 is supplied to a through hole 20*h* formed in the dielectric window 20. The processing gas supplied to the through hole 20*h* of the dielectric window 20 is injected into the processing space S through cells 100, which will be described below, provided in the dielectric window 20, and is excited by microwaves supplied to the processing space S from the antenna 18 through the resonator array structure of the dielectric window 20. Accordingly, the processing gas is converted into plasma within the processing space S, and the object to be processed WP is processed by ions and radicals contained in the plasma.

The control device 11 includes a processor, a memory, and an input and output interface. A program, process recipe, and the like are stored in the memory. The processor centrally controls each portion of the apparatus body 10 through the input and output interface on the basis of the process recipe stored in the memory by reading and executing the program from the memory.

For example, when plasma is generated in the processing space S, the control device 11 performs control so that the microwaves supplied to the processing space S by the antenna 18 resonate with the plurality of resonators 101, in a target frequency band higher than a resonance frequency of the plurality of resonators 101 to be described below. Here, the resonance frequency is, for example, a frequency at which a transmission characteristic value (for example, an S21 value) of the plurality of resonators 101 becomes a minimum value.

[Details of Dielectric Window]

Figure 2:
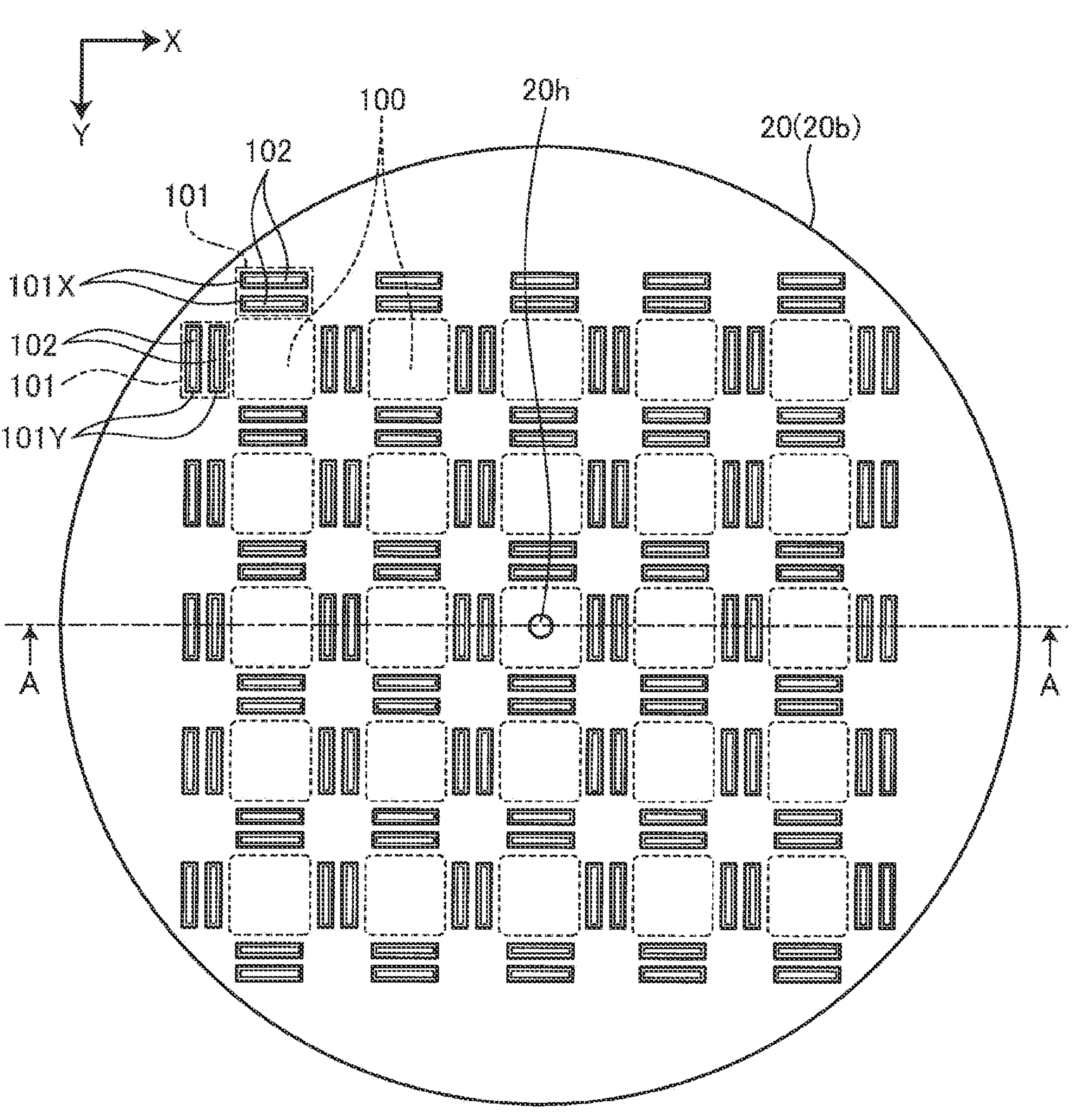
FIG. 2 is a plan view illustrating an example of a configuration when a dielectric window according to the first embodiment is viewed from above.
Figure 3:
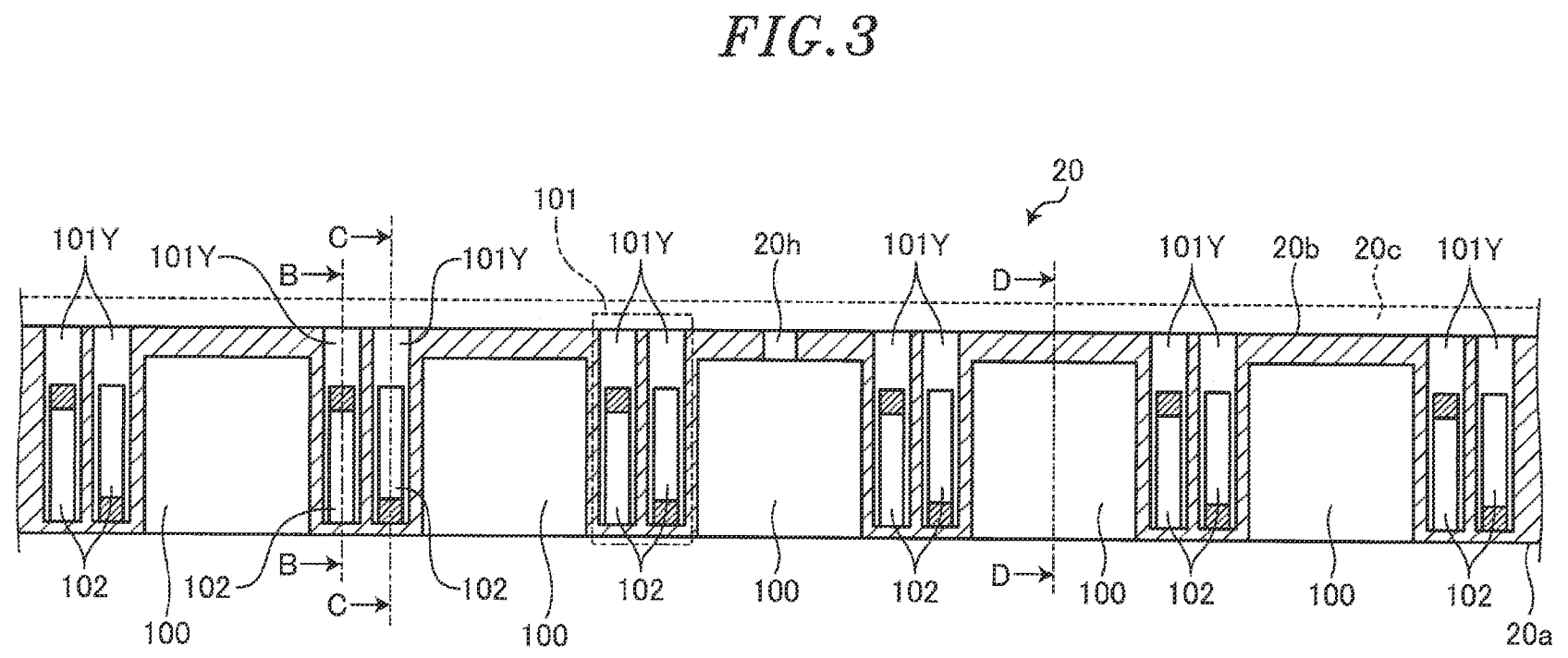

Here, a detailed configuration of the dielectric window 20 will be described with reference to FIGS. 1 to 5. FIG. 2 is a plan view illustrating an example of a configuration when the dielectric window according to the first embodiment is viewed from above. In FIG. 2, the upper surface 20*b* of the disk-shaped dielectric window 20 is illustrated. FIG. 3 is a cross-sectional view illustrating an example of a A-A cross section of FIG. 2. Further, in the following description, the resonator array structure of the dielectric window 20 may be expressed as a meta material, and the resonator 101 may be expressed as a meta atom 101.

The dielectric window 20 is made of ceramics such as quartz, silicon carbide, aluminum nitride, silicon nitride, or alumina. The dielectric window 20 includes a plurality of cells 100 which are plasma generation spaces on the lower surface 20*a* side. The cells 100 are formed from the lower surface 20*a* in square column shape, for example, and are provided in a lattice shape. Further, the cell 100 may have a cylindrical shape. In the present embodiment, the cells 100 are arranged in five rows and five columns, but the number of cells 100 may be changed to any number depending on a size of the object to be processed WP, which is a processing target. Further, the through hole 20*h* is formed in the central cell 100. One side of the cell 100 is larger than a diameter of a ring member 102. Further, the dielectric window 20 includes, on the upper surface 20*b* side, grooves 101X and 101Y into which the C-shaped ring member 102 made of a conductor is inserted. Two grooves 101X and two grooves 101Y are provided around the cell 100, that is, on all sides. Further, one groove 101X and one groove 101Y may be provided around the cell 100, that is, on all sides. The groove 101X is provided in an X-axis direction, and the groove 101Y is provided in a Y-axis direction.

Further, as illustrated in FIGS. 2 and 3, the cell 100 and the grooves 101X and 101Y are not in communication, and the airtightness of the processing space S on the lower surface 20*a* side of the dielectric window 20 is secured. Further, the dielectric window 20 may be provided with a cover member 20*c* made of a dielectric above the upper surface 20*b*. The cover member 20*c* may be provided for each of the grooves 101X and 101Y. Further, the lower surface 20*a*, the inside of the cell 100, and the upper surface 20*b* are polished. When the cover member 20*c* is provided on the upper surface 20*b*, this can improve contact with the cover member 20*c*. Since the ring member 102 is not exposed on the lower surface 20*a* and the cell 100 side, it is possible to curb the generation of particles or contamination. Further, the dielectric window 20 has heat resistance and plasma resistance since only the dielectric is exposed on the processing space S side.

The ring members 102 inserted into the grooves 101X and 101Y constitute the resonator 101 in a form in which a portion of the dielectric window 20 between the ring member 102 and an adjacent ring member 102 is included. In other words, the resonator array structure (meta material) of the dielectric window 20 is formed by arranging a plurality of resonators (meta atoms) 101 that are capable of resonating with the magnetic field components of the microwaves and have a size smaller than the wavelength of the microwave in a lattice shape. Each of the plurality of resonators 101 constitutes a series resonance circuit configured of a capacitor equivalent element and a coil equivalent element. The ring member 102 is formed of, for example, copper, brass, or iron, and a surface thereof is plated with silver or gold. A thickness of the ring member 102 is, for example, about 0.1 mm. Further, the thickness of the ring member 102 may be 0.1 mm or more. Further, in each drawing, the thickness of the ring member 102 is emphasized for illustration purposes. Further, a gap is provided between the grooves 101X and 101Y and the ring member 102 to cope with thermal expansion.

Figure 4:
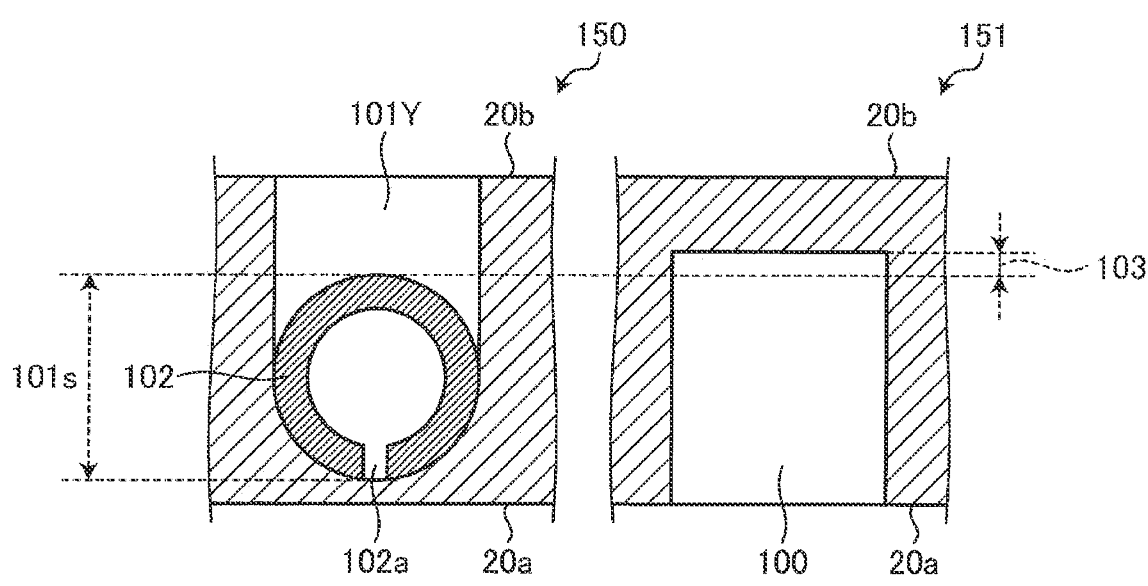
FIG. 4 is a cross-sectional view illustrating examples of a B-B cross section and a D-D cross section of FIG. 3.
Figure 5:
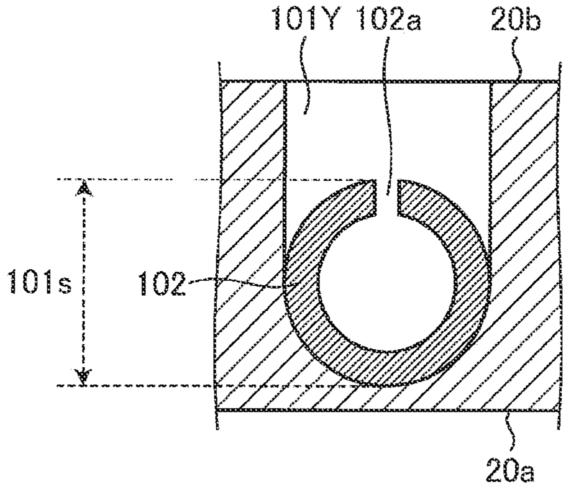
FIG. 5 is a cross-sectional view illustrating an example of a C-C cross section of FIG. 3.

FIG. 4 is a cross-sectional view illustrating examples of a B-B cross section and a D-D cross section of FIG. 3. FIG. 5 is a cross-sectional view illustrating an example of a C-C cross section of FIG. 3. A cross section 150 in FIG. 4 represents the B-B cross section in FIG. 3 and is a cross section of the groove 101Y and the ring member 102 inserted into the groove 101Y. A cross section 151 of FIG. 4 represents the D-D cross section of FIG. 3 and is a cross section of the cell 100. The C-C cross section of FIG. 3 is a cross section of the groove 101Y, and the ring member 102 inserted into the groove 101Y. As illustrated in the cross section 150 of FIG. 4, and FIG. 5, the groove 101Y has a U-shaped cross section. Further, the ring members 102 with the B-B cross section and the ring members 102 with the C-C cross section are disposed so that the C-shaped openings 102*a* are alternately symmetrical with respect to centers of the respective ring members 102. In other words, the C-shaped openings 102*a* of the ring members 102 inserted into the two adjacent grooves 101Y are at a position rotated by 180° with centers of the respective ring member 102*s* being the same. In this case, a size 101*s* of the resonator 101 becomes a diameter of the ring member 102. Further, a vertex portion of the ring member 102 inserted into the groove 101Y is located on the lower surface 20*a* side relative the upper surface 20*b* of the cell 100 as indicated by a distance 103. Further, since the groove 101X and the ring member 102 inserted into the groove 101X are the same as the groove 101Y and the ring member 102 inserted into the groove 101Y, description thereof will be omitted.

Figure 6:
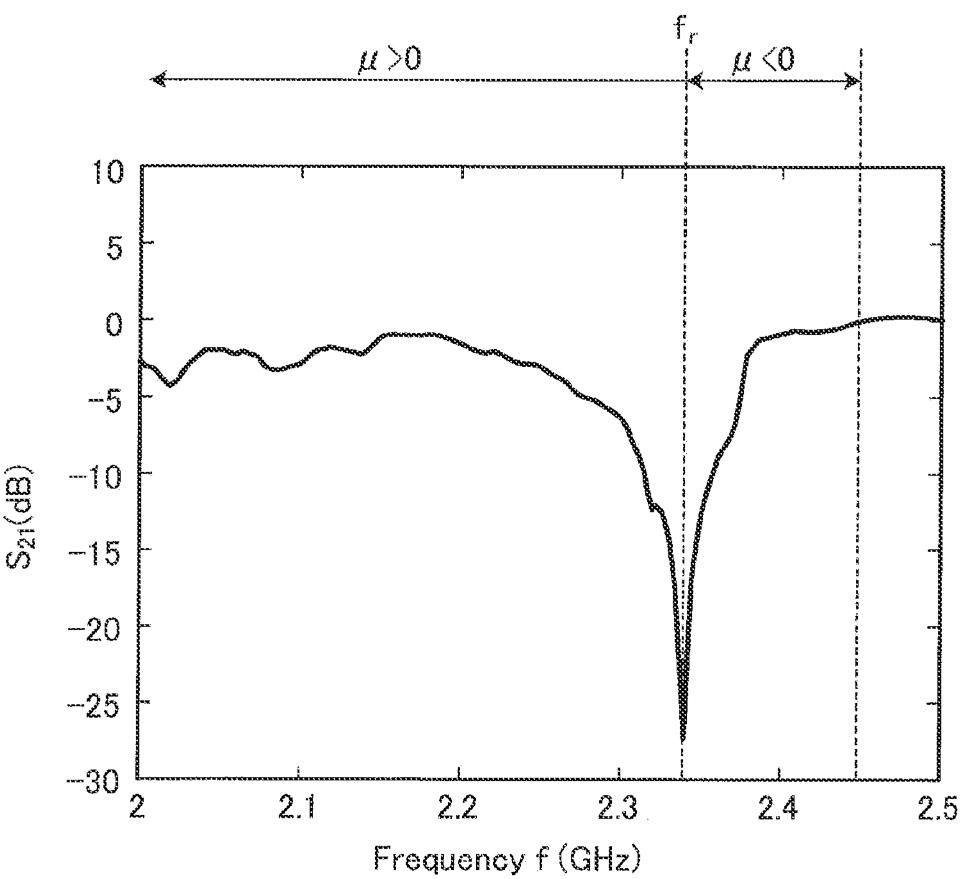
FIG. 6 is a diagram illustrating an example of a relationship between an S21 value of a resonator including a C-shaped ring member and a frequency of a microwave.

FIG. 6 is a diagram illustrating an example of the relationship between the S21 value of the resonator including a C-shaped ring member and a frequency of microwaves. When the frequency of the microwaves supplied to the processing space S by the antenna 18 matches a resonance frequency fr (=about 2.35 GHz) of the plurality of resonators 101, the S21 value of the plurality of resonators 101 is a minimum value and resonance between the microwaves and the plurality of resonators 101 occurs. The resonance between the microwaves and the plurality of resonators 101 is also maintained in a predetermined frequency band (for example, about 0.1 GHz) higher than the resonance frequency fr of the plurality of resonators 101. In the predetermined frequency band higher than the resonance frequency fr of the plurality of resonators 101, both the permittivity and the permeability of the processing space S can be both made negative by resonance of the microwaves and the plurality of resonators 101, and it is possible to propagate microwaves in the processing space S as seen from Equation above. The target frequency band in the present embodiment is set to a predetermined frequency band (for example, about 0.1 GHz) higher than the resonance frequency fr of the plurality of resonators 101. The target frequency band is preferably within 0.05 times the resonance frequency fr of the plurality of resonators 101, for example. Further, in measurement of the resonance frequency fr of the resonator 101 including the ring member 102, the resonance frequency fr may be measured by, for example, a vector network analyzer with a transmission and reception antenna disposed in a radial direction of the dielectric window 20 or in the adjacent cell 100. Further, the resonance frequency fr of the resonator 101 is set according to a thickness of the dielectric window 20 between the two adjacent grooves 101Y (between the two adjacent grooves 101X) and the diameter of the ring member 102.

Further, as for propagation of electromagnetic waves for a plurality of resonators, a relationship among a resonance frequency, a refractive index, permittivity, and permeability is reported, for example, by D. R. Smith, D. C. Vier, Th. Koschny, and C. M. Soukoulis in "Electromagnetic parameter retrieval from inhomogeneous metamaterials" in "PHYSICAL REVIEW E 71, 036617 (2005)".

Thus, even when the electron density of the plasma reaches the cutoff density due to resonance between the microwaves and the plurality of resonators 101 in the target frequency band higher than the resonance frequency fr of the plurality of resonators 101, the propagation of the microwave can be made beyond the skin depth of the plasma. To this end, power of microwaves can be efficiently absorbed into the plasma. As a result, it is possible to generate high density plasma in a wide range beyond the skin depth of the plasma. That is, with the plasma processing apparatus 1 according to the present embodiment, it is possible to realize high density in a wide range of plasma through resonance between the microwaves and the plurality of resonators 101 in the target frequency band higher than the resonance frequency fr of the plurality of resonators 101. Further, since the resonator array structure is integrated into the dielectric window 20, for example, a structure such as provision of a separate dielectric window on an aluminum upper plate may not be adopted, and it is possible to reduce a size of the processing chamber 12. Further, in the present embodiment, spreading of the plasma outward in a horizontal direction of the outermost resonator 101 is suppressed. That is, it is possible to curb plasma generation near the side wall 12*a*. To this end, it is possible to curb damage to the side wall 12*a* caused by plasma.

Second Embodiment

Although in the first embodiment, the two ring members 102 are used in each resonator 101, three or more ring members 102 may be disposed so that the C-shaped openings are alternately symmetrical, and an embodiment in the case of three ring members 102 will be described as a second embodiment. Further, since a plasma processing apparatus in the second embodiment is the same as that in the first embodiment described above except for a configuration of the dielectric window, description of repeated configurations and operations will be omitted.

Figure 7:
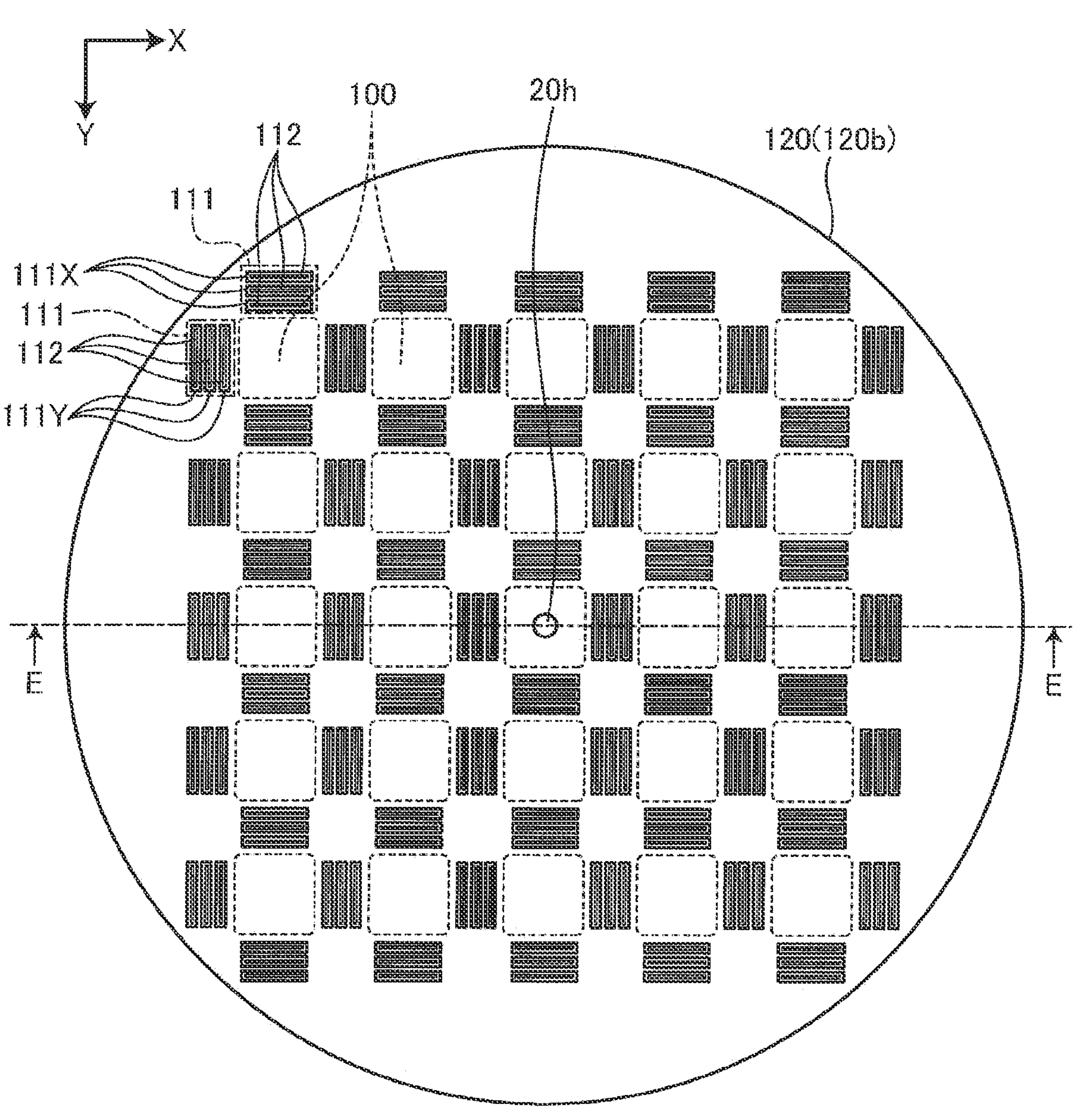
FIG. 7 is a plan view illustrating an example of a configuration when a dielectric window according to a second embodiment is viewed from above.
Figure 8:
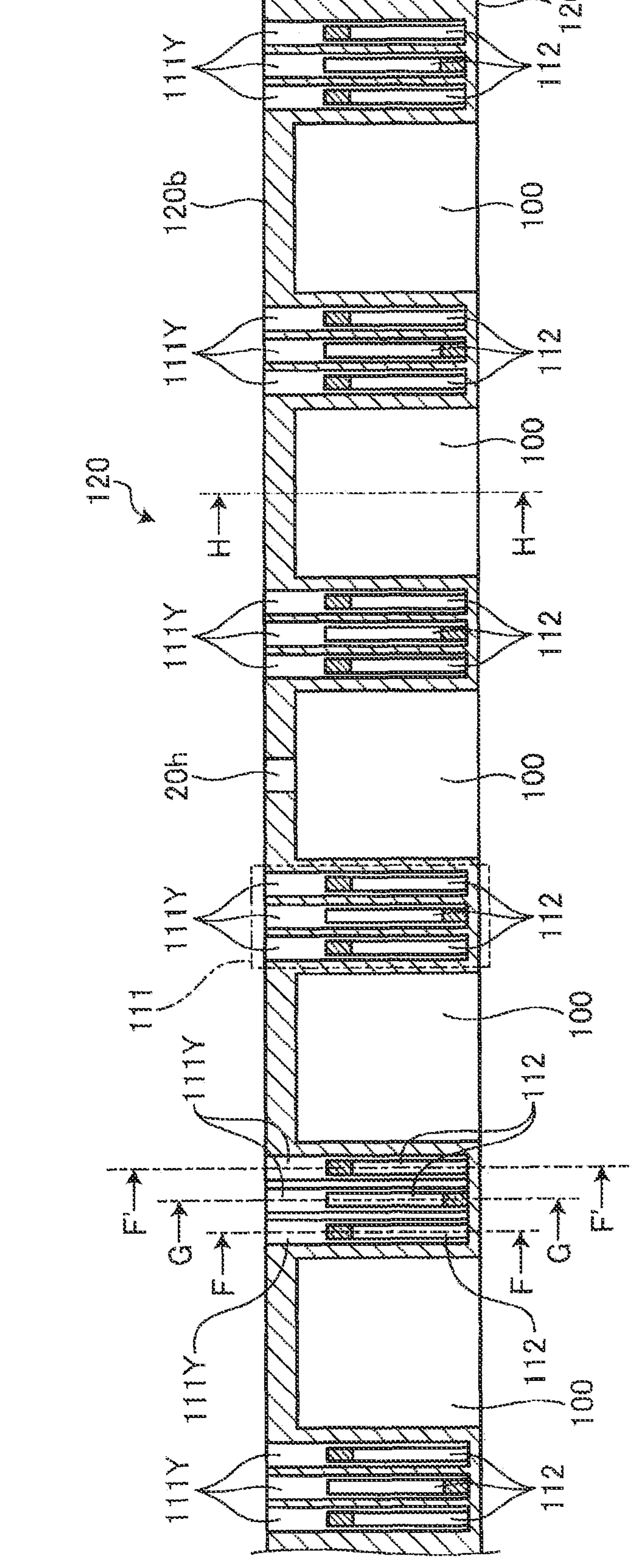
FIG. 8 is a cross-sectional view illustrating an example of an E-E cross section of FIG. 7.

FIG. 7 is a plan view illustrating an example of a configuration when the dielectric window according to the second embodiment is viewed from above. The plasma processing apparatus of the second embodiment includes a dielectric window 120 instead of the dielectric window 20 of the first embodiment. In FIG. 7, an upper surface 120*b* of the disk-shaped dielectric window 120 is illustrated. FIG. 8 is a cross-sectional view illustrating an example of an E-E cross section of FIG. 7.

The dielectric window 120 is made of ceramics such as quartz, silicon carbide, aluminum nitride, silicon nitride, or alumina. The dielectric window 120 includes a plurality of cells 100 which are plasma generation spaces on the lower surface 120*a* side. The cells 100 are formed from the lower surface 120*a* side in a square column shape, for example, and are provided in a lattice shape. Further, the cell 100 may have a cylindrical shape. Further, the through hole 20*h* is formed in the central cell 100. A length and depth of one side of the cell 100 are larger than a diameter of the ring member 112. Further, the dielectric window 120 includes, on the upper surface 120*b* side, grooves 111X and 111Y into which the C-shaped ring member 112 made of a conductor is inserted. Three grooves 111X and three grooves 111Y are provided around the cell 100, that is, on all sides. Further, the groove 111X is provided in the X-axis direction, and the groove 111Y is provided in the Y-axis direction. Further, as illustrated in FIGS. 7 and 8, the cell 100 and the grooves 111X and 111Y are not in communication, and the airtightness of the processing space S on the lower surface 120*a* side of the dielectric window 120 is ensured.

The ring members 112 inserted into the grooves 111X and 111Y constitute a resonator 111 in a form in which a portion of the dielectric window 120 between the ring member 112 and the adjacent ring member 112 is included. In other words, the resonator array structure (meta material) of the dielectric window 120 is formed by arranging a plurality of resonators (meta atoms) 111 that are capable of resonating with the magnetic field components of the microwaves and have size smaller than the wavelength of the microwave in a lattice shape. Each of the plurality of resonators 111 constitutes a series resonance circuit configured of a capacitor equivalent element and a coil equivalent element. The ring member 112 is formed of, for example, copper, brass, or iron, and a surface thereof is plated with silver or gold. The thickness of the ring member 112 may be smaller than the ring member 102, or may be, for example, about 0.1 mm like the ring member 102. Further, the thickness of the ring member 112 may be 0.1 mm or more, like the ring member 102.

Figure 9:
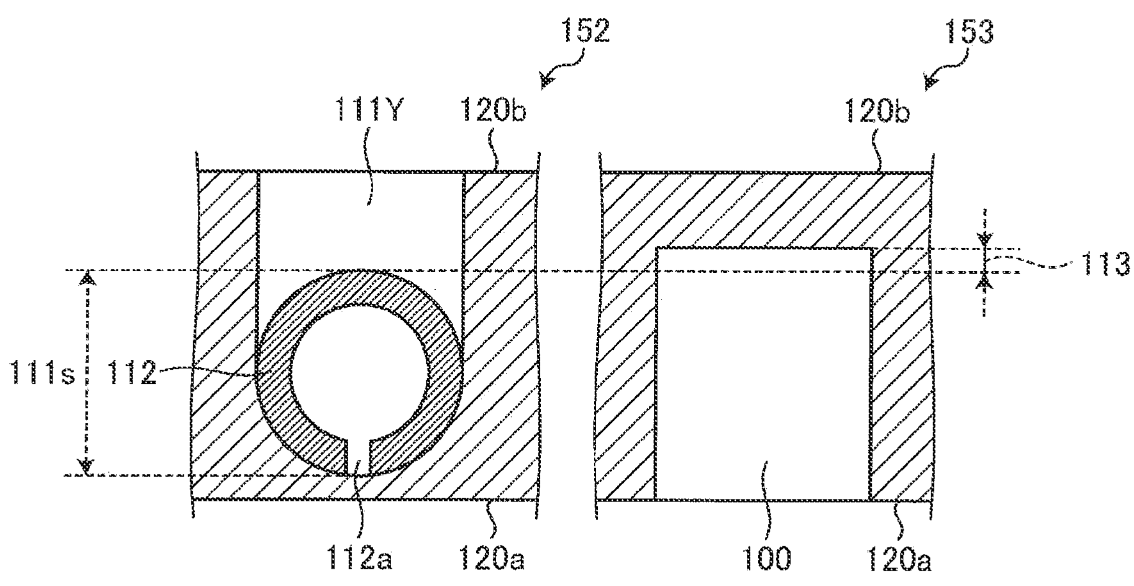
FIG. 9 is a cross-sectional view illustrating examples of an F-F cross section and an H-H cross section of FIG. 8.
Figure 10:
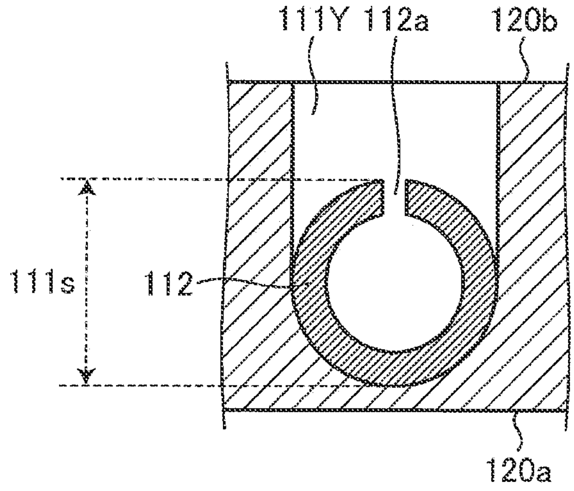
FIG. 10 is a cross-sectional view illustrating an example of a G-G cross section of FIG. 8.

FIG. 9 is a cross-sectional view illustrating examples of a F-F cross section and an H-H cross section of FIG. 8. FIG. 10 is a cross-sectional view illustrating an example of a G-G cross section of FIG. 8. A cross section 152 of FIG. 9 represents an F-F cross section and an F'-F' cross section of FIG. 8, and is a cross section of the groove 111Y and the ring member 112 inserted into the groove 111Y. A cross section 153 of FIG. 9 represents the H-H cross section of FIG. 8 and is a cross section of the cell 100. The G-G cross section of FIG. 8 illustrated in FIG. 10 is a cross section of the groove 111Y, and the ring member 112 inserted into the groove 111Y. In this case, the ring members 112 with the cross sections F-F and F'-F' and the ring members 112 with the cross section G-G are disposed such that the C-shaped openings 112*a* are alternately symmetrical with respect to the centers of the respective ring members 112. In other words, the C-shaped openings 112*a* of the respective ring members 112 inserted into the three adjacent grooves 111Y are at positions alternately rotated by 180° with centers of the respective ring members 112 that is the same. In this case, a size 111*s* of the resonator 111 becomes the diameter of the ring member 112. Further, a vertex portion of the ring member 112 inserted into the groove 111Y is located on the lower surface 120*a* side relative to the upper surface 120*b* of the cell 100 as indicated by a distance 113. Further, since the groove 111X and the ring member 112 inserted into the groove 111X are the same as the groove 111Y and the ring member 112 inserted into the groove 111Y, description thereof will be omitted.

Similarly, in the second embodiment, since the resonator array structure is also integrated into the dielectric window 120, it is possible to miniaturize the processing chamber 12. Further, spreading of the plasma outward in the horizontal direction of the outermost resonator 111 is curbed. That is, it is possible to curb plasma generation near the side wall 12*a*. To this end, it is possible to curb damage to the side wall 12*a* caused by plasma.

Third Embodiment

Although two grooves 101X or two grooves 101Y are provided as the resonator 101 in the first embodiment, two or more ring members 102 may be inserted into one groove. Therefore, an embodiment in which two ring members are disposed on a front and back of one dielectric plate will be described as a third embodiment. Further, since a plasma processing apparatus in the third embodiment is the same as that in the first embodiment described above except for a configuration of the dielectric window, description of repeated configurations and operations will be omitted.

Figure 11:
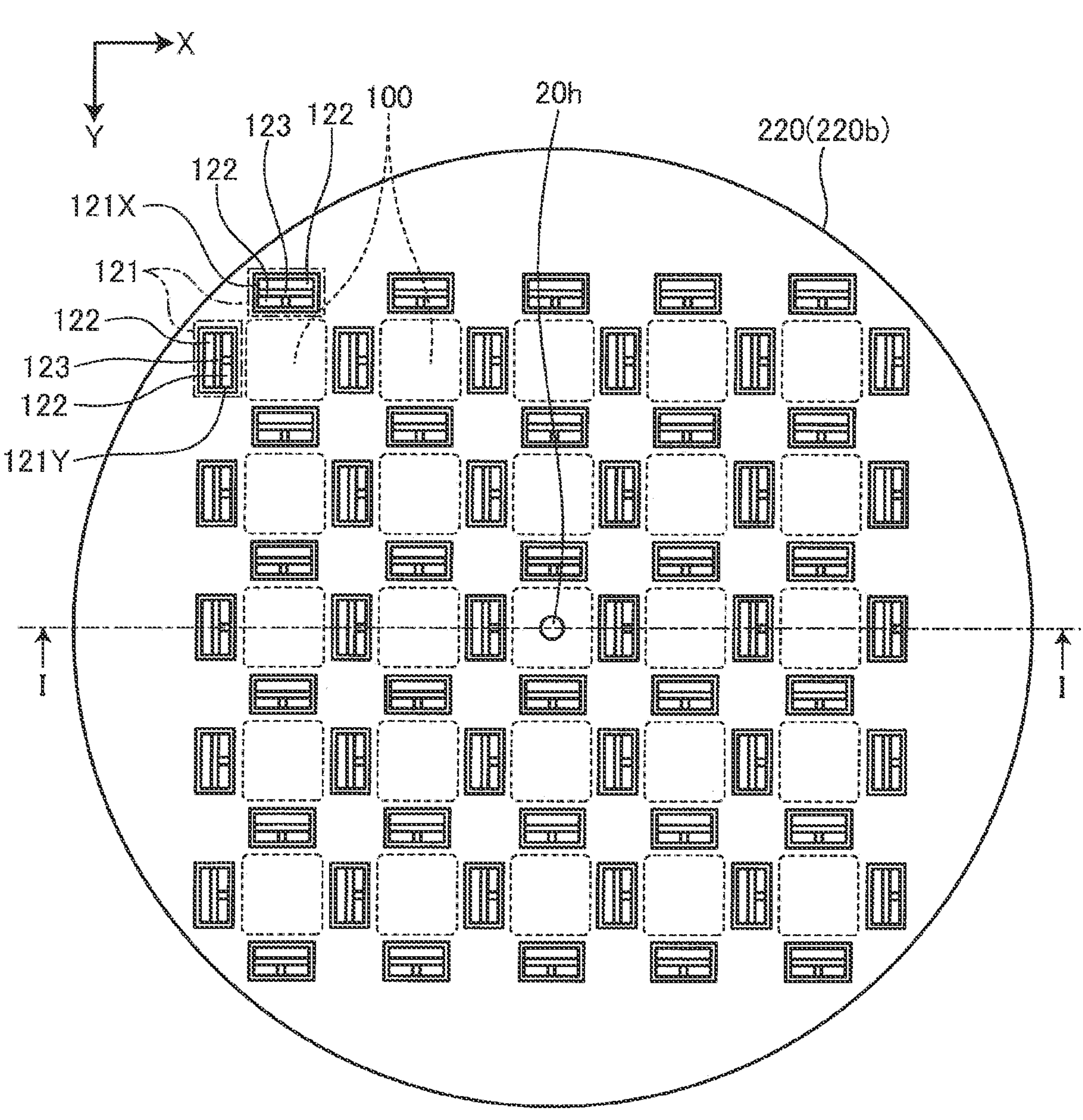
FIG. 11 is a plan view illustrating an example of a configuration when a dielectric window according to a third embodiment is viewed from above.
Figure 12:
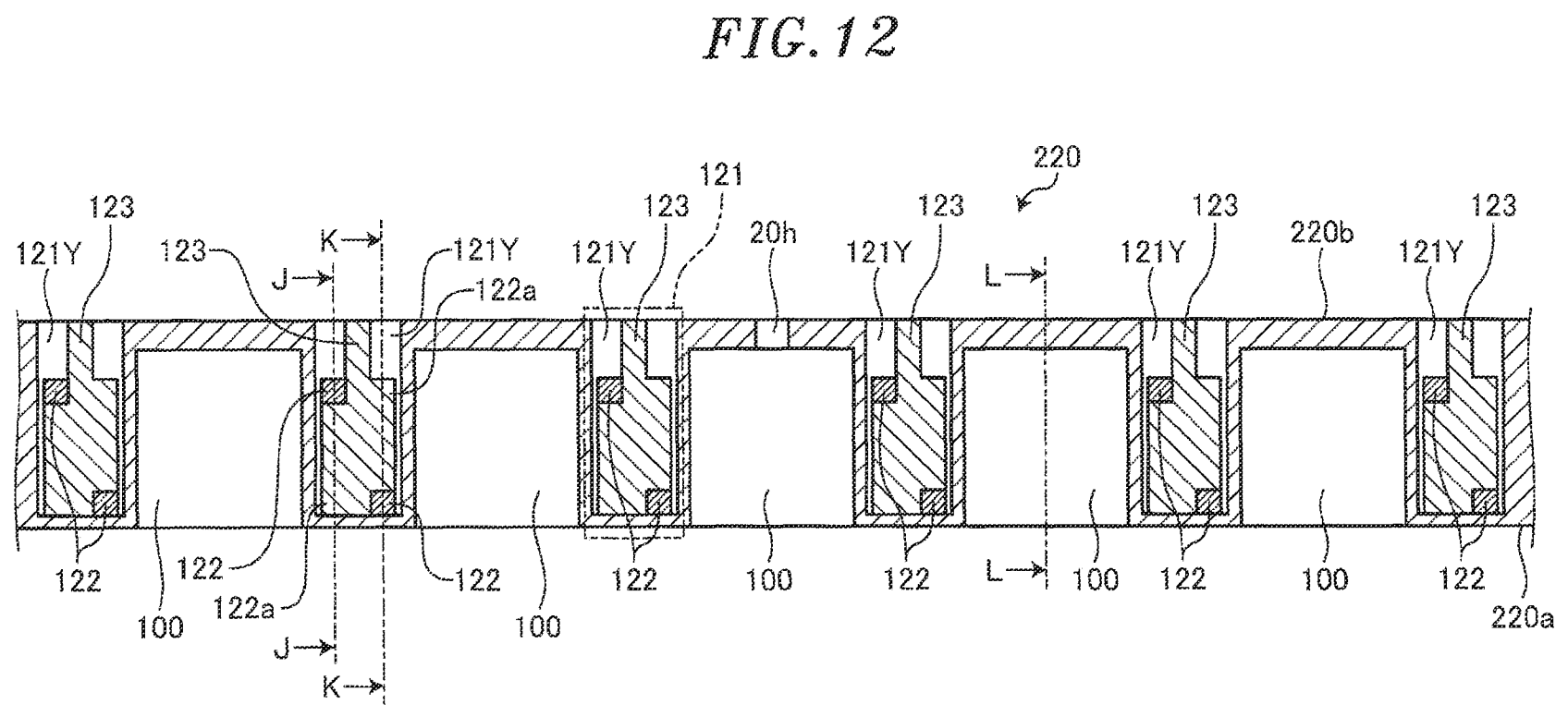

FIG. 11 is a plan view illustrating an example of a configuration when the dielectric window according to the third embodiment is viewed from above. The plasma processing apparatus of the third embodiment includes a dielectric window 220 instead of the dielectric window 20 of the first embodiment. In FIG. 11, an upper surface 220*b* of the disk-shaped dielectric window 220 is illustrated. FIG. 12 is a cross-sectional view illustrating an example of an I-I cross section of FIG. 11.

The dielectric window 220 is made of ceramics such as quartz, silicon carbide, aluminum nitride, silicon nitride, or alumina. The dielectric window 220 includes a plurality of cells 100 which are plasma generation spaces on the lower surface 220*a* side. The cells 100 are formed from the lower surface 220*a* side in a square column shape, for example, and are provided in a lattice shape. Further, the cell 100 may have a cylindrical shape. Further, the through hole 20*h* is formed in the central cell 100. A length and depth of one side of the cell 100 are larger than the diameter of the ring member 122. Further, the dielectric window 220 includes, on the upper surface 220*b* side, grooves 121X and 121Y into which the C-shaped ring member 122 made of a conductor and the dielectric plate 123 are inserted. One groove 121X and one groove 121Y are provided around the cell 100, that is, on all sides. Further, the groove 121X is provided in the X-axis direction, and the groove 121Y is provided in the Y-axis direction. Further, as illustrated in FIGS. 11 and 12, the cell 100 and the grooves 101X and 101Y are not in communication, and the airtightness of the processing space S on the lower surface 220*a* side of the dielectric window 220 is secured.

The two ring members 122 inserted into each of the grooves 121X and 121Y constitute the resonator 111 in a form in which the dielectric plate 123 is included. The two ring members 122 are disposed on the front and back of the dielectric plate 123 such that the C-shaped openings 122*a* are alternately symmetrical with respect to the centers of the respective ring members 122. That is, the two ring members 122 and the dielectric plate 123 are assembled to be integrated, and inserted into the grooves 121X and 121Y. In other words, the resonator array structure (meta material) of the dielectric window 220 is formed by arranging a plurality of resonators (meta atoms) 121 that are capable of resonating with the magnetic field components of the microwaves and have a size smaller than the wavelength of the microwave in a lattice shape. Each of the plurality of resonators 121 constitutes a series resonance circuit configured of a capacitor equivalent element and a coil equivalent element.

The ring member 122 is formed of, for example, copper, brass, or iron, and a surface thereof is plated with silver or gold. The thickness of the ring member 122 is, for example, about 0.1 mm like the ring member 102. Further, the thickness of the ring member 122 may be 0.1 mm or more, like the ring member 102. The dielectric plate 123 is formed of, for example, ceramics, such as quartz, silicon carbide, aluminum nitride, silicon nitride, or alumina. The dielectric plate 123 may be formed of a different material from the dielectric window 220. Further, the resonance frequency fr of the resonator 121 is set by the thickness of the dielectric plate 123 between the two ring members 122 and the diameter of the ring member 122. In other words, in the third embodiment, since the thickness of the dielectric plate 123 can be changed, a setting range of the resonance frequency fr can be widened.

Figure 13:
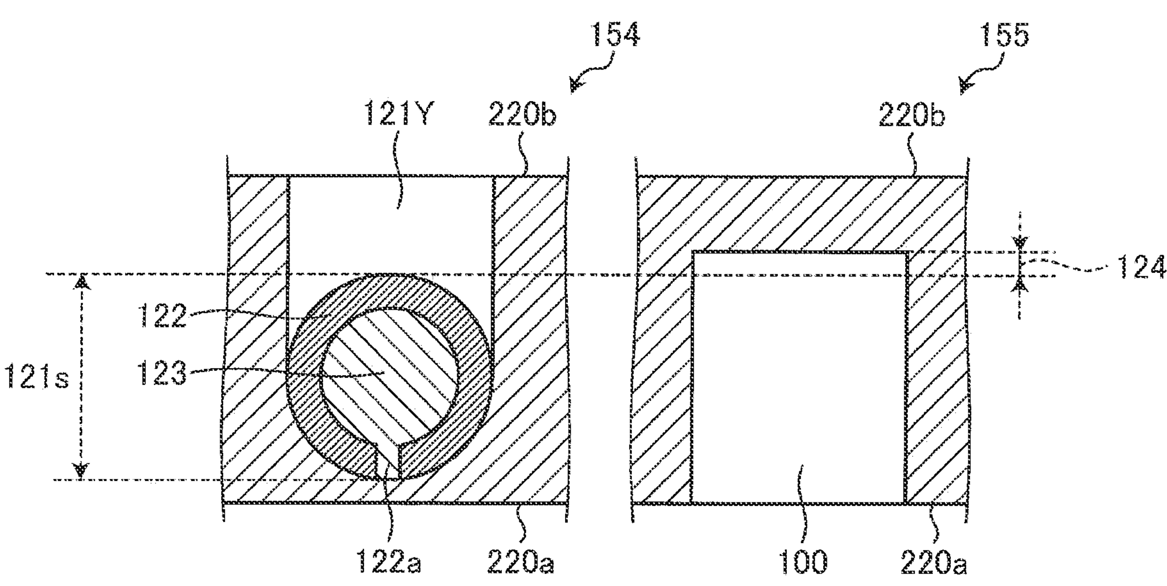
FIG. 13 is a cross-sectional view illustrating examples of a J-J cross section and an L-L cross section of FIG. 12.
Figure 14:
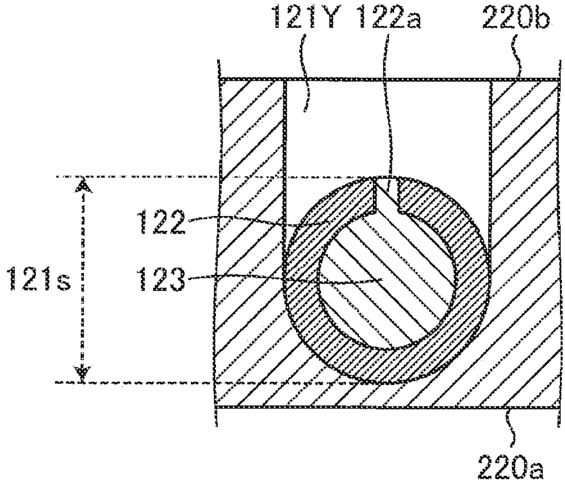
FIG. 14 is a cross-sectional view illustrating an example of a K-K cross section of FIG. 12.

FIG. 13 is a cross-sectional view illustrating examples of a J-J cross section and an L-L cross section of FIG. 12. FIG. 14 is a cross-sectional view illustrating an example of a K-K cross section of FIG. 12. A cross section 154 in FIG. 13 represents the J-J cross section of FIG. 12 and is a cross section of the groove 121Y, and the ring member 122 and the dielectric plate 123 inserted into the groove 121Y. A cross section 155 of FIG. 13 represents the L-L cross section in FIG. 12 and is a cross section of the cell 100. The K-K cross section of FIG. 12 illustrated in FIG. 14 is a cross section of the groove 121Y, and the ring member 122 and the dielectric plate 123 inserted into the groove 121Y. In this case, the ring member 122 with the J-J cross section and the ring member 122 with the K-K cross section are disposed so that the C-shaped openings 122*a* are alternately symmetrical with respect to the centers of the respective ring members 122. In other words, the C-shaped openings 122*a* of the respective ring members 122 inserted into the grooves 121Y are at a position rotated by 180° with the centers of the respective ring members 122 being the same. In this case, a size 121*s* of the resonator 121 becomes a diameter of the ring member 122. Further, a vertex of the ring member 122 inserted into the groove 121Y is located on the lower surface 220*a* relative to a surface of the cell 100 on the upper surface 220*b* as indicated by a distance 124. Further, since the groove 121X, and the ring member 122 and the dielectric plate 123 inserted into the groove 121X are the same as the groove 121Y, and the ring member 122 and the dielectric plate 123 inserted into the groove 121Y, description thereof will be omitted.

Similarly, in the third embodiment, since the resonator array structure is also integrated into the dielectric window 220, it is possible to miniaturize the processing chamber 12. Further, spreading of the plasma outward in the horizontal direction of the outermost resonator 121 is curbed. That is, it is possible to curb plasma generation near the side wall 12*a*. To this end, it is possible to curb damage to the side wall 12*a* caused by the plasma.

Modification Examples 1 to 4

Here, the arrangement of the ring members and the modification of the cell structure will be described as Modification Examples 1 to 4 of the dielectric window 20. Further, since a plasma processing apparatus in Modification Examples 1 to 4 is the same as that in the first embodiment described above except for the arrangement of the ring members and the structure of the cell, description of repeated configurations and operations will be omitted.

Figure 15:
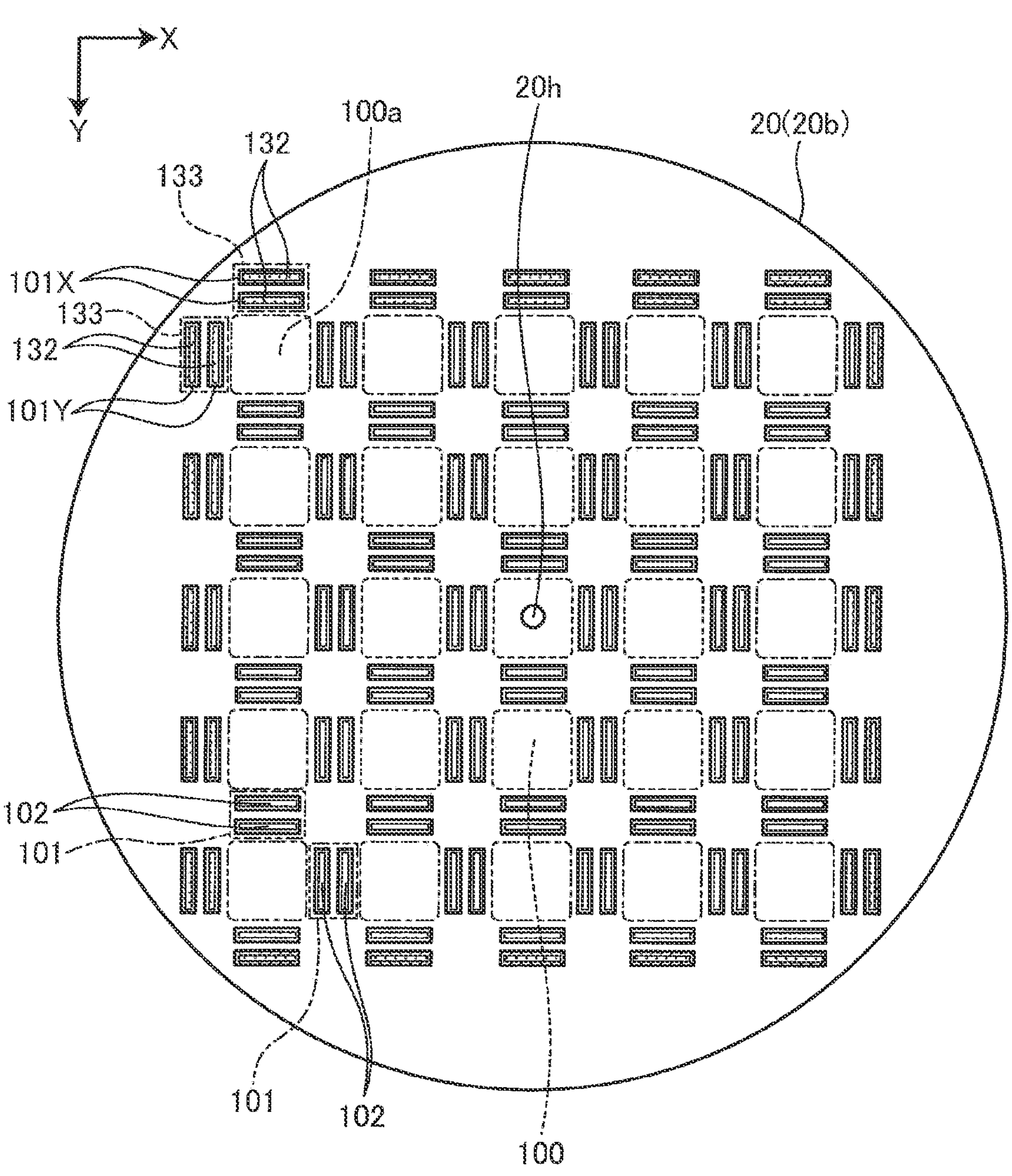
FIG. 15 is a plan view illustrating an example of a configuration of a dielectric window according to Modification Example 1 as viewed from above.

FIG. 15 is a plan view illustrating an example of a configuration of the dielectric window according to Modification Example 1 when viewed from above. In FIG. 15, the upper surface 20*b* of the disk-shaped dielectric window 20 is illustrated. In Modification Example 1, the ring members inserted into the outermost grooves 101X and 101Y are changed from the ring members 102 of the first embodiment to the ring members 132. The ring members 132 inserted into the outermost grooves 101X and 101Y constitute a resonator 133 in a form in which a portion of the dielectric window 20 between the ring member 132 and the adjacent ring member 132 is included. Each outermost resonator 133 has a different resonance frequency fr (is non-resonant) from that of each resonator 101 including inner ring members 102. In Modification Example 1, for example, the resonator 101 has a resonance frequency fr (=about 2.35 GHz). Further, for example, the resonator 133 has a resonance frequency fr (=about 2.15 GHz or about 2.55 GHz) that is a predetermined frequency (for example, ±0.2 GHz) away from the resonance frequency fr of the resonator 101. In Modification Example 1, there is the cell 100 of which all sides are surrounded by the resonator 101 and the cell 100*a* of which one or both sides are surrounded by the resonator 133. Further, the through hole 20*h* is formed in the central cell 100. In this case, in the cell 100*a*, since the number of resonators 101 resonating at a resonance frequency fr corresponding to the frequency output from the microwave output apparatus 16 is smaller than that in the cell 100, the density of the plasma is lower than that in the cell 100 and the spreading of the plasma to the outside of the outermost resonator 133 can be further curbed. Further, in Modification Example 1, none of the ring members 102 and 132 may be inserted instead of the ring members 132 being inserted into the outermost grooves 101X and 101Y.

Figure 16:
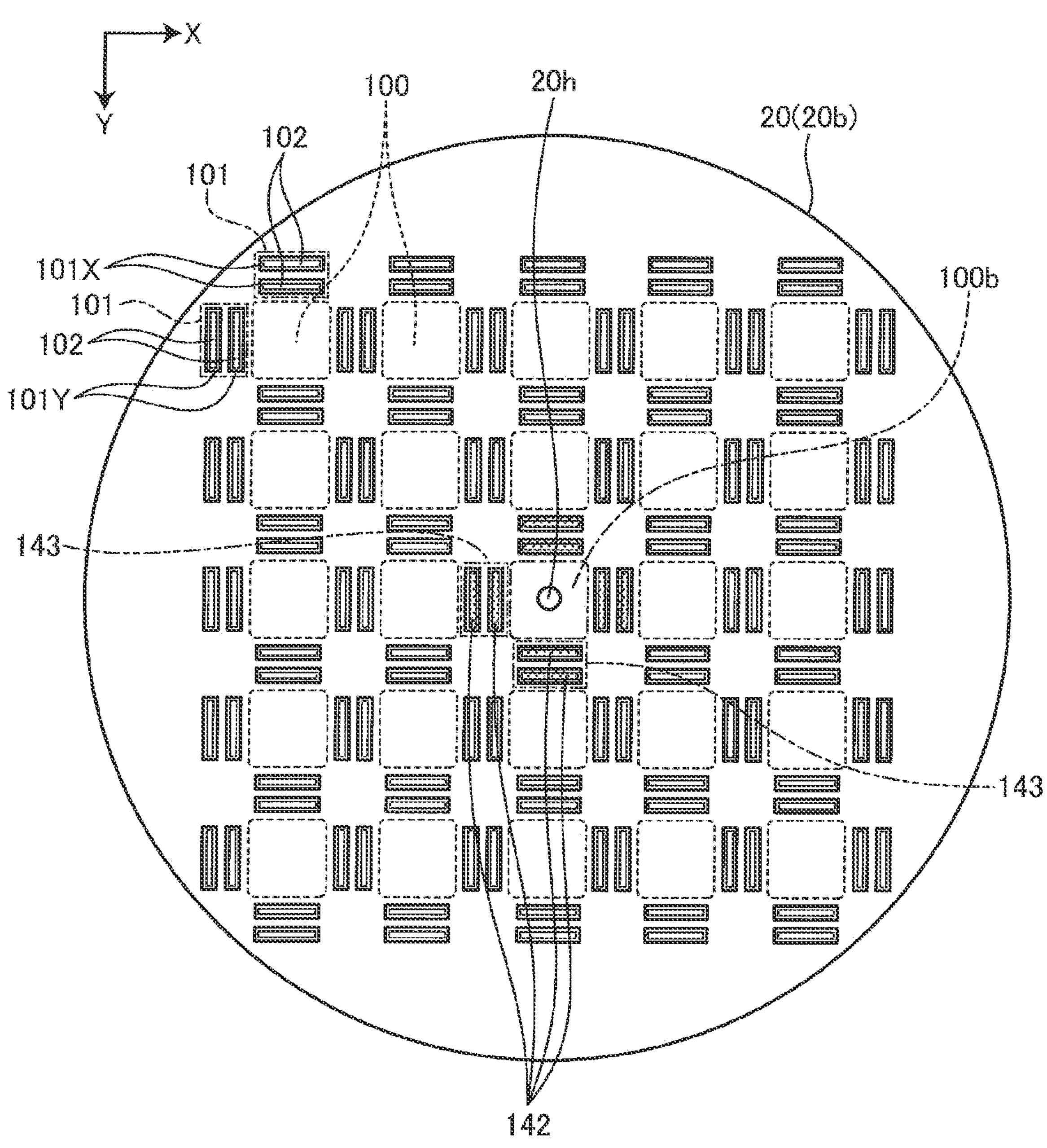
FIG. 16 is a plan view illustrating an example of a configuration of a dielectric window according to Modification Example 2 as viewed from above.

FIG. 16 is a plan view illustrating an example of a configuration of the dielectric window according to Modification Example 2 when viewed from above. In FIG. 16, the upper surface 20*b* of the disk-shaped dielectric window 20 is illustrated. In Modification Example 2, the ring member inserted into the grooves 101X and 101Y around a central cell 100*b* in which the through hole 20*h* is formed is changed from the ring member 102 in the first embodiment to the ring member 142. The ring members 142 inserted into the grooves 101X and 101Y around the central cell 100*b* constitute a resonator 143 in a form in which a portion of the dielectric window 20 between the ring member 142 and the adjacent ring member 142 is included. Each resonator 143 has a different resonance frequency fr from each resonator 101 including the other ring member 102 (is non-resonant). In Modification Example 2, for example, the resonator 101 has a resonance frequency fr (=about 2.35 GHz). Further, for example, the resonator 143 has a resonance frequency fr (=about 2.15 GHz or about 2.55 GHz) that is a predetermined frequency (for example, ±0.2 GHz) away from the resonance frequency fr of the resonator 101.

In Modification Example 2, plasma is generated in each cell 100, whereas plasma is not generated in the cell 100*b* since the cell is surrounded by a non-resonant resonator 143. Further, since the plasma generated in each cell 100 is confined in each cell 100, spreading within the cell 100*b* and outward in a horizontal direction of the outermost resonator 101 is curbed. That is, in Modification Example 2, it is possible to curb plasma generation near the through hole 20*h* and near the side wall 12*a*. To this end, it is possible to curb damage to the through hole 20*h* and the side wall 12*a* caused by plasma. Further, in Modification Example 2, none of the ring members 102 and 142 may be inserted instead of the ring members 142 being inserted into the grooves 101X and 101Y around the cell 100*b*.

Figure 17:
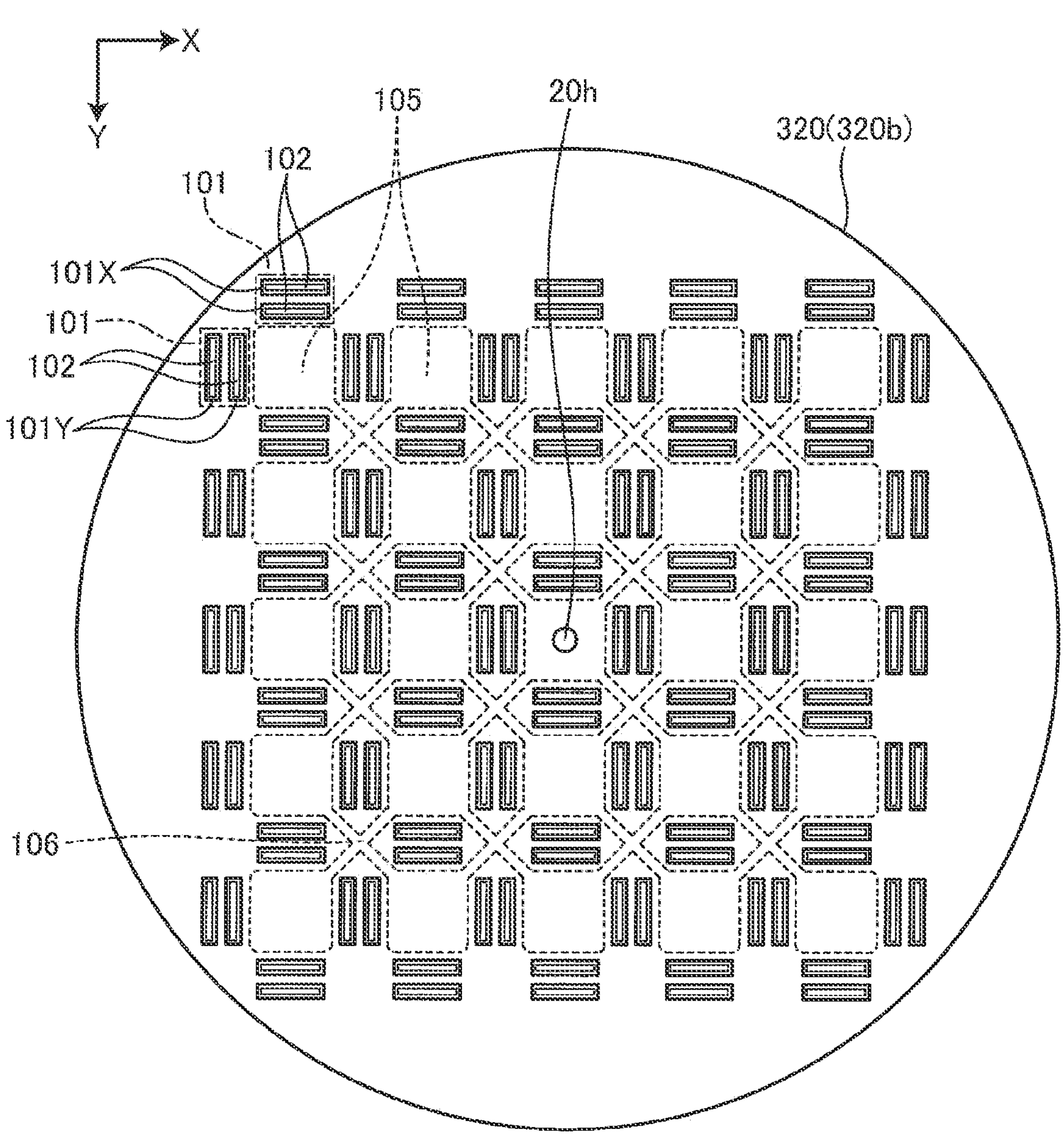
FIG. 17 is a plan view illustrating an example of a configuration of a dielectric window according to Modification Example 3 as viewed from above.

FIG. 17 is a plan view illustrating an example of a configuration of the dielectric window according to Modification Example 3 when viewed from above. In FIG. 17, an upper surface 320*b* of the disk-shaped dielectric window 320 is illustrated. The dielectric window 320 of Modification Example 3 includes a cell 105 instead of the cell 100 of the dielectric window 20 of the first embodiment. Further, the through hole 20*h* is provided in the central cell 105. A through hole 106 connecting the adjacent cells 105 is formed between the cells 105. The through hole 106 passes between the grooves 101X and 101Y of each resonator 101 and connects the cells 105. In other words, provision of the through hole 106 enables gas or plasma to flow in and out between each cell 105 and the adjacent cell 105. In other words, plasma continuity can be secured in the adjacent cells 105.

Figure 18:
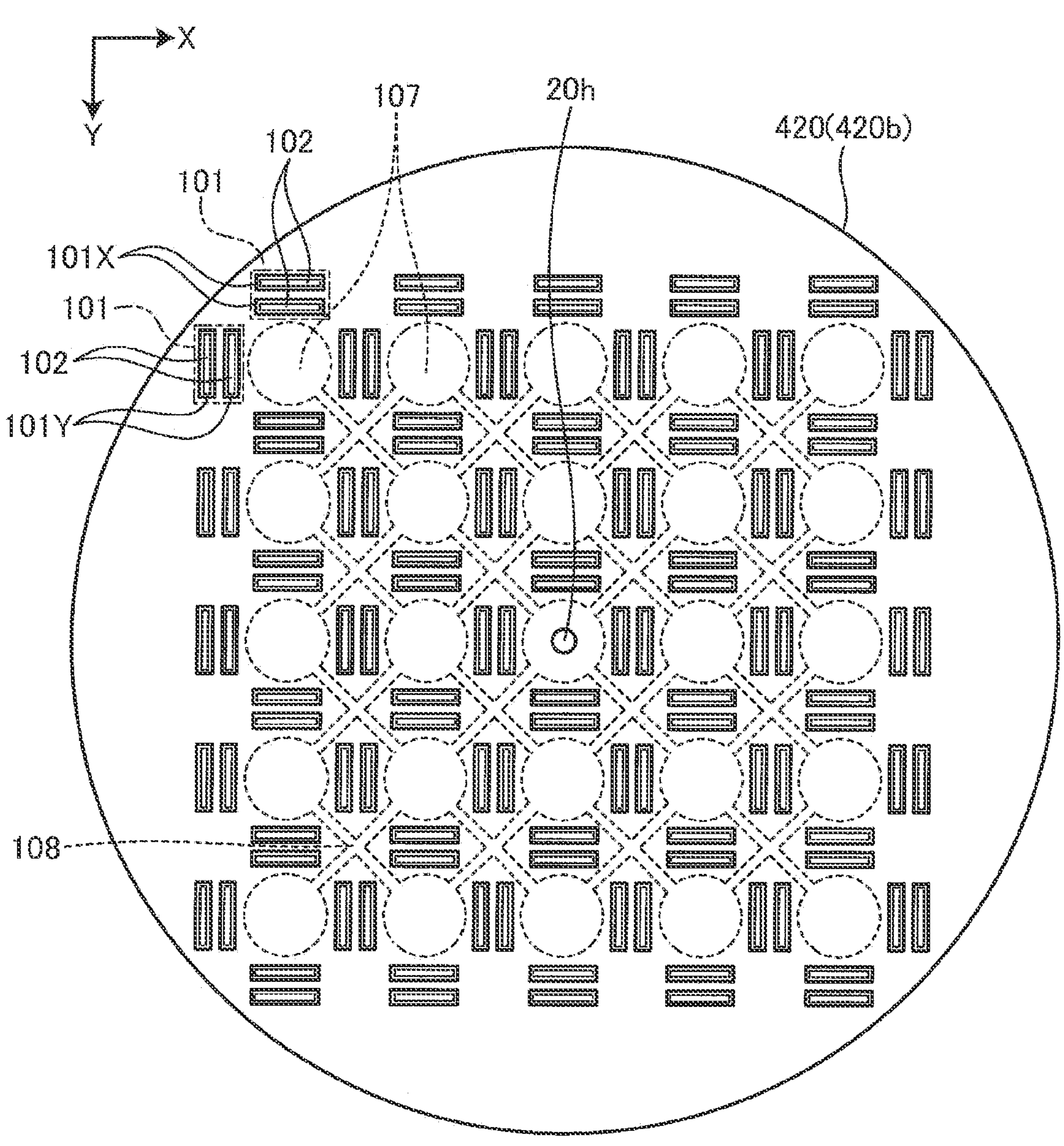
FIG. 18 is a plan view illustrating an example of a configuration of a dielectric window according to Modification Example 4 as viewed from above.

FIG. 18 is a plan view illustrating an example of a configuration of the dielectric window according to Modification Example 4 when viewed from above. In FIG. 18, an upper surface 420*b* of the disk-shaped dielectric window 420 is illustrated. The dielectric window 420 of Modification Example 4 includes a cylindrical cell 107 instead of the cell 105 of the dielectric window 320 of Modification Example 3. Further, the through hole 20*h* is provided in a central cell 107. A through hole 108 connecting the adjacent cells 107 is formed between the cell 107. The through hole 108 passes between the grooves 101X and 101Y of each resonator 101 to connect the cells 107. In other words, provision of the through hole 108 enables gas or plasma to flow in and out between each cell 107 and the adjacent cell 107. In other words, plasma continuity can be secured in the adjacent cells 107.

In the first embodiment, when the plasma is ignited, a form of the magnetic field entering the cell 100 changes depending on temporal change in the microwaves or a timing of a pulse, which may cause the cell 100 to not ignite. When a state becomes stable after the ignition of the plasma, the state is desired to be maintained as is, and thus, cells in which the plasma has not been ignited (discharged) are maintained in an unignited state. Thus, when there is a cell in which the plasma has not been ignited, the uniformity of plasma processing deteriorates.

On the other hand, in the dielectric windows 320 and 420 of Modification Examples 3 and 4, the plasma spreads to the adjacent cells 105 and 107 from the cells 105 and 107 in which the plasma has been ignited pass through the through holes 106 and 108, and it becomes easy for the plasma to be ignited even in the cells 105 and 107 in which the plasma has not been ignited. In other words, in the dielectric windows 320 and 420, the plasma is ignited in the cells 105 and 107 in which the plasma has not been ignited, in a plasma assisted (chained) manner by using the plasma of the cells 105 and 107 in which the plasma has been ignited. Meanwhile, since the outermost cells 105 and 107 do not have outward through holes 106 and 108, spreading of the plasma outward in a horizontal direction of the outermost resonator 101 is curbed. Further, in Modification Examples 3 and 4, the uniformity of the plasma in the respective cells 105 and 107 can be improved. In other words, in Modification Examples 3 and 4, it is possible to generate high density plasma and improve in-plane uniformity for the object to be processed WP. Further, it is possible to perform so that plasma density can change in a center portion and a peripheral portion by combining dispositions of the through holes 106 and 108.

Other Modification Examples

Further, in each of the above embodiments, a case in the dielectric window 20, 120, 220, 320, or 420 is formed by arranging the plurality of resonators 101, 111, or 121 that are capable of resonating with the magnetic field components of the microwaves and have a size smaller than the wavelength of the microwave in a lattice shape has been described as an example. The present disclosure is not limited thereto, and the arrangement of the plurality of resonators 101, 111, and 121 may be any arrangement such as a triangular shape or a hexagonal shape. In this case, a shape of the cells 100 and 105 may be a shape such as a triangular columnar shape or a hexagon columnar shape.

As described above, according to each embodiment, the plasma processing apparatus 1 includes the processing chamber 12, the electromagnetic wave generator (the microwave output apparatus 16), and the dielectric (the dielectric window 20, 120, 220, 320 or 420), and an electromagnetic wave supply portion (the antenna 18). The processing chamber 12 provides the processing space S. The electromagnetic wave generator generates electromagnetic waves for plasma excitation that are supplied to the processing space S. The dielectric is provided with a first surface thereof facing the processing space S. The electromagnetic wave supply portion supplies the electromagnetic waves to the processing space S through the dielectric. Further, the dielectric includes the cells 100, 105, and 107 serving as plasma generation spaces on the first surface, and includes, on a second surface opposite to the first surface, a plurality of grooves (grooves 101X, 101Y, 111X, 111Y, 121X, and 121Y) that do not communicate with the cells 100, 105, and 107 while surrounding the cells 100, 105, and 107, and a plurality of resonators 101, 111, and 121 formed of the C-shape ring members 102, 112, and 122 including conductors inserted into the plurality of respective grooves and a part of the dielectric, being capable of resonating with the magnetic field components of the electromagnetic wave, and having a size smaller than a wavelength of the electromagnetic wave. As a result, it is possible to realize high density in a wide range of plasma. Further, it is possible to miniaturize the processing chamber 12. Further, it is possible to curb spreading of the plasma outward in the horizontal direction of the outermost resonator 101.

Further, according to the first and second embodiments, one ring member 102 or 112 is inserted into one groove (the groove 101X, 101Y, 111X, or 111Y). As a result, the ring members 102 and 112 can be exchanged one by one.

Further, according to each embodiment, one groove 101X and one groove 101Y are formed on each side of the four sides of the cell 100. As a result, it is possible to realize high density in a wide range of plasma. Further, it is possible to miniaturize the processing chamber 12.

Further, according to the first embodiment, two grooves 101X and two grooves 101Y are formed on each side of the four sides of the cell 100. As a result, it is possible to realize high density in a wide range of plasma. Further, it is possible to miniaturize the processing chamber 12.

Further, according to the second embodiment, three grooves 111X and three grooves 111Y are formed on each side of the four sides of the cell 100. As a result, it is possible to realize high density in a wide range of plasma. Further, it is possible to miniaturize the processing chamber 12.

Further, according to the first and second embodiments, a plurality of ring members 102 inserted into a plurality of grooves (grooves 101X, 101Y, 111X, and 111Y) formed on each side of the four sides of the cell 100 have the same shape. As a result, it is possible to realize high density in a wide range of plasma.

Further, according to the first and second embodiments, the plurality of ring members 102 and 112 are disposed so that the C-shaped openings 102*a* and 112*a* are alternately symmetrical with respect to centers of the ring members 102 and 112. As a result, it is possible to realize high density in a wide range of plasma.

Further, according to the third embodiment, a plurality of ring members 122 are inserted into one groove 121X or 121Y. As a result, the plurality of ring members 122 can be attached to and detached from the dielectric window 220 as one set.

Further, according to the third embodiment, two ring members 122 of the plurality of ring members 122 are disposed on both sides of the dielectric plate 123 so that the C-shaped openings 122*a* are symmetrical with respect to centers of the ring member 122, and the dielectric plate 123 is inserted into the grooves 121X and 121Y. As a result, the plurality of ring members 122 can be attached to and detached from the dielectric window 220 as one set.

Further, according to each embodiment, the ring member is formed of copper, brass, or iron. As a result, it is possible to constitute a resonance circuit.

Further, according to each embodiment, the surface of the ring member is plated with silver or gold. As a result, it is possible to constitute a resonance circuit capable of resonating in a microwave region.

Further, according to each embodiment, the dielectric is formed of ceramics such as quartz, silicon carbide, aluminum nitride, silicon nitride, or alumina. As a result, the microwaves can be supplied to the processing space S, and a resonator array structure can be formed.

Further, according to each embodiment, the cells 100 and 105 have a square column shape. As a result, the plasma generation space can be widened.

Further, according to Modification Example 4, the cell 107 has a cylindrical shape. As a result, it becomes easy to form the through hole 108 connecting the cells 107.

Further, according to Modification Example 1, a plurality of cells 100 and 100*a* are formed in a grid shape on the first surface side of the dielectric, and a resonance frequency of a plurality of resonators 133 including a plurality of ring members 132 inserted into the outermost grooves 101X and 101Y is a frequency that does not resonate with electromagnetic waves. Further, the resonance frequency of the plurality of the outermost resonators 133 is, for example, a resonance frequency fr (=about 2.15 GHz or about 2.55 GHz)±0.2 GHz away when the resonance frequency fr of the plurality of other resonators 101 resonating with the microwaves is set to about 2.35 GHz. As a result, it is possible to further curb spreading of the plasma outward in the horizontal direction of the outermost resonator 133.

Further, according to Modification Example 2, the plasma processing apparatus 1 further includes, in the dielectric, a gas nozzle (the through hole 20*h*) for introducing a gas for generating the plasma into the processing chamber. Further, a plurality of cells 100 are formed in a grid shape on the first surface side of the dielectric and a resonance frequency of a plurality of resonators 143 including a plurality of ring members inserted into the grooves 101X and 101Y around the cell 100*b* in which the gas nozzle is located is a frequency that does not resonate with electromagnetic waves. As a result, it is possible to curb damage caused by plasma to the gas nozzle.

Further, according to Modification Examples 3 and 4, a plurality of cells 105 and 107 are formed in a grid shape on the first surface side of the dielectric, and through holes 106 and 108 connecting cells 105 and 107 are formed between the plurality of cells 105 and 107. As a result, it is possible to the in-plane uniformity of plasma.

Each of the embodiments disclosed this time should be considered as being illustrative in all respects and not restrictive. Each of the above-described embodiments may be omitted, replaced, or changed in various forms without departing from the scope of the appended claims and the spirit thereof.

Further, in each of the above-described embodiments, the plasma processing apparatus 1 including one antenna 18 and the corresponding dielectric window 20, 120, 220, 320, or 420 has been described, but the present disclosure is not limited thereto. For example, each of the above-described embodiments may be combined with a plasma processing apparatus having a plurality of antennas and a plurality of corresponding dielectric windows.

Further, the present disclosure can also have the following configurations.

(1) A plasma processing apparatus comprising:
- a processing chamber configured to provide a processing space;
- an electromagnetic wave generator configured to generate electromagnetic waves for plasma excitation supplied to the processing space;
- a dielectric provided with a first surface facing the processing space; and
- an electromagnetic wave supply portion configured to supply the electromagnetic waves to the processing space through the dielectric, wherein the dielectric includes:
- a cell serving as a plasma generation space on the first surface side of the dielectric,
- a plurality of grooves formed on a second surface opposite to the first surface, the grooves surrounding the cell without communicating with the cell; and
- a plurality of resonators including C-shaped ring members made of conductors inserted into the plurality of grooves, wherein the resonators are formed as a part of the dielectric, and the resonators are capable of resonating with magnetic field components of the electromagnetic waves and have a size smaller than a wavelength of the electromagnetic wave.

(2) The plasma processing apparatus of (1), wherein the ring members are inserted one by one into each of the grooves.

(3) The plasma processing apparatus of (2), wherein one groove is formed on each of four sides of the cell.

(4) The plasma processing apparatus of (2), wherein two grooves are formed on each of four sides of the cell.

(5) The plasma processing apparatus of (2), wherein three grooves are formed on each of four sides of the cell.

(6) The plasma processing apparatus of (4) or (5), wherein the ring members inserted into the grooves formed on each of four sides of the cell have the same shape.

(7) The plasma processing apparatus of (6), wherein the C-shaped ring members are arranged such that openings of the C-shaped ring members are alternately symmetrical with respect to a center of the ring members.

(8) The plasma processing apparatus of (1), wherein a plurality of the C-shaped ring members are inserted into each of the grooves.

(9) The plasma processing apparatus of (8), wherein two C-shaped ring members are arranged on both sides of a dielectric plate such that openings of the C-shaped ring members are symmetrical with respect to a center of the ring members, and the dielectric plate with the two ring members is inserted into the groove.

(10) The plasma processing apparatus of any one of (1) to (9), wherein the ring member is formed of copper, brass, or iron.

(11) The plasma processing apparatus of any one of (1) to (10), wherein a surface of the ring member is plated with silver or gold.

(12) The plasma processing apparatus of any one of (1) to (11), wherein the dielectric is formed of quartz, silicon carbide, aluminum nitride, silicon nitride, or alumina.

(13) The plasma processing apparatus of any one of (1) to (12), wherein the cell has a square column shape.

(14) The plasma processing apparatus of any one of (1) to (12), wherein the cell has a cylindrical shape.

(15) The plasma processing apparatus of any one of (1) to (14), wherein a plurality of the cells are formed in a lattice shape on the first surface side of the dielectric, and
- a resonance frequency of the plurality of resonators, including a plurality of the ring members inserted into an outermost groove, is a frequency that does not resonate with the electromagnetic wave.

(16) The plasma processing apparatus of any one of (1) to (15), wherein the dielectric further includes a gas nozzle configured to introduce a gas for generating the plasma into the processing chamber,
- a plurality of the cells are formed in a lattice shape on the first surface side of the dielectric, and
- a resonance frequency of the plurality of resonators, including a plurality of the ring members inserted into the grooves around the cell in which the gas nozzle is located, is a frequency that does not resonate with the electromagnetic wave.

(17) The plasma processing apparatus of any one of (1) to (16), wherein a plurality of the cells are formed in a lattice shape on the first surface side of the dielectric, and a through hole connecting the cells is formed between the cells.

The invention claimed is:

1. A plasma processing apparatus comprising:

a processing chamber configured to provide a processing space;

an electromagnetic wave generator configured to generate electromagnetic waves for plasma excitation supplied to the processing space;

a dielectric provided with a first surface facing the processing space; and an electromagnetic wave supply portion configured to supply the electromagnetic waves to the processing space through the dielectric, wherein the dielectric includes:

a cell serving as a plasma generation space on the first surface side of the dielectric, a plurality of grooves formed on a second surface opposite to the first surface, the grooves surrounding the cell without communicating with the cell; and a plurality of resonators including C-shaped ring members made of conductors inserted into the plurality of grooves, wherein the resonators are formed as a part of the dielectric, and the resonators are capable of resonating with magnetic field components of the electromagnetic waves and have a size smaller than a wavelength of the electromagnetic wave.

2. The plasma processing apparatus of claim 1, wherein the ring members are inserted one by one into each of the grooves.

3. The plasma processing apparatus of claim 2, wherein one groove is formed on each of four sides of the cell.

4. The plasma processing apparatus of claim 2, wherein two grooves are formed on each of four sides of the cell.

5. The plasma processing apparatus of claim 2, wherein three grooves are formed on each of four sides of the cell.

6. The plasma processing apparatus of claim 4, wherein the ring members inserted into the grooves formed on each of four sides of the cell have the same shape.

7. The plasma processing apparatus of claim 5, wherein the ring members inserted into the grooves formed on each of four sides of the cell have the same shape.

8. The plasma processing apparatus of claim 6, wherein the C-shaped ring members are arranged such that openings of the C-shaped ring members are alternately symmetrical with respect to a center of the ring members.

9. The plasma processing apparatus of claim 7, wherein the C-shaped ring members are arranged such that openings of the C-shaped ring members are alternately symmetrical with respect to a center of the ring members.

10. The plasma processing apparatus of claim 1, wherein a plurality of the C-shaped ring members are inserted into each of the grooves.

11. The plasma processing apparatus of claim 10, wherein two C-shaped ring members are arranged on both sides of a dielectric plate such that openings of the C-shaped ring members are symmetrical with respect to a center of the ring members, and the dielectric plate with the two ring members is inserted into the groove.

12. The plasma processing apparatus of claim 1, wherein the ring member is formed of copper, brass, or iron.

13. The plasma processing apparatus of claim 1, wherein a surface of the ring member is plated with silver or gold.

14. The plasma processing apparatus of claim 1, wherein the dielectric is formed of quartz, silicon carbide, aluminum nitride, silicon nitride, or alumina.

15. The plasma processing apparatus of claim 1, wherein the cell has a square column shape.

16. The plasma processing apparatus of claim 1, wherein the cell has a cylindrical shape.

17. The plasma processing apparatus of claim 1, wherein a plurality of the cells are formed in a lattice shape on the first surface side of the dielectric, and a resonance frequency of the plurality of resonators, including a plurality of the ring members inserted into an outermost groove, is a frequency that does not resonate with the electromagnetic wave.

18. The plasma processing apparatus of claim 1, wherein the dielectric further includes a gas nozzle configured to introduce a gas for generating the plasma into the processing chamber, a plurality of the cells are formed in a lattice shape on the first surface side of the dielectric, and a resonance frequency of the plurality of resonators, including a plurality of the ring members inserted into the grooves around the cell in which the gas nozzle is located, is a frequency that does not resonate with the electromagnetic wave.

19. The plasma processing apparatus of claim 1, wherein a plurality of the cells are formed in a lattice shape on the first surface side of the dielectric, and a through hole connecting the cells is formed between the cells.

* * * * *